United States Patent
Wang et al.

(10) Patent No.: US 9,373,605 B1
(45) Date of Patent: Jun. 21, 2016

(54) DIE PACKAGES AND METHODS OF MANUFACTURE THEREOF

(71) Applicant: Taiwan Semiconductor Manufacturing Company, Ltd., Hsin-Chu (TW)

(72) Inventors: Chuei-Tang Wang, Taichung (TW); Chen-Hua Yu, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/801,277

(22) Filed: Jul. 16, 2015

(51) Int. Cl.
*H01L 21/00* (2006.01)
*H01L 23/02* (2006.01)
*H01L 25/065* (2006.01)
*H01L 23/498* (2006.01)
*H01L 23/31* (2006.01)
*H01L 21/48* (2006.01)
*H01L 21/56* (2006.01)

(52) U.S. Cl.
CPC .......... *H01L 25/0657* (2013.01); *H01L 21/486* (2013.01); *H01L 21/4853* (2013.01); *H01L 21/4857* (2013.01); *H01L 21/565* (2013.01); *H01L 23/3121* (2013.01); *H01L 23/49822* (2013.01); *H01L 23/49827* (2013.01); *H01L 23/49838* (2013.01); *H01L 23/49894* (2013.01); *H01L 2225/06541* (2013.01)

(58) Field of Classification Search
CPC ...................... H01L 25/0657; H01L 23/49827; H01L 23/3121; H01L 21/4853; H01L 21/4857; H01L 21/486; H01L 21/565; H01L 2225/06503; H01L 2225/0651
USPC ...... 438/109, FOR. 368, FOR. 426; 257/686, 257/777, E25.006, E25.021, E25.027, 257/E23.085, E25.013
See application file for complete search history.

(56) References Cited

U.S. PATENT DOCUMENTS

| | | | |
|---|---|---|---|
| 7,993,972 B2* | 8/2011 | Lin | H01L 21/6835 216/14 |
| 8,361,842 B2 | 1/2013 | Yu et al. | |
| 8,680,647 B2 | 3/2014 | Yu et al. | |
| 8,703,542 B2 | 4/2014 | Lin et al. | |
| 8,729,714 B1* | 5/2014 | Meyer | H01L 23/5389 257/686 |
| 8,759,964 B2 | 6/2014 | Pu et al. | |
| 8,778,738 B1 | 7/2014 | Lin et al. | |
| 2007/0035033 A1* | 2/2007 | Ozguz | H01L 21/4803 257/777 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0168848 A1 | 7/2013 | Lin et al. | |
| 2013/0307140 A1 | 11/2013 | Huang et al. | |
| 2013/0334680 A1* | 12/2013 | Boone | A61N 1/3956 257/737 |
| 2014/0203429 A1 | 7/2014 | Yu et al. | |
| 2014/0225222 A1 | 8/2014 | Yu et al. | |
| 2014/0252646 A1 | 9/2014 | Hung et al. | |
| 2014/0264930 A1 | 9/2014 | Yu et al. | |

* cited by examiner

*Primary Examiner* — Jasmine Clark
(74) *Attorney, Agent, or Firm* — Slater Matsil, LLP

(57) ABSTRACT

Die packages and method of manufacturing the same are disclosed. In an embodiment, a method of manufacturing a die package may include forming an encapsulated via structure including at least one via, a polymer layer encapsulating the at least one via, and a first molding compound encapsulating the polymer layer; placing the encapsulated via structure and a first die stack over a carrier, the at least one via having a first end proximal the carrier and a second end distal the carrier; encapsulating the first die stack and the encapsulated via structure in a second molding compound; and forming a first redistribution layer (RDL) over the second molding compound, the first RDL electrically connecting the at least one via.

20 Claims, 20 Drawing Sheets

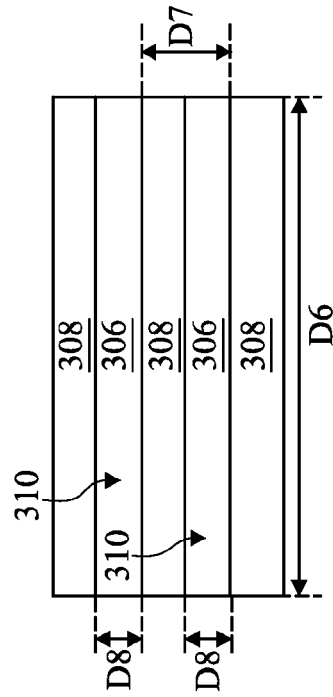
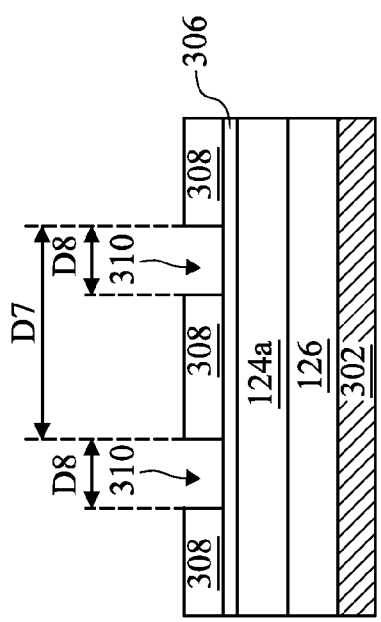
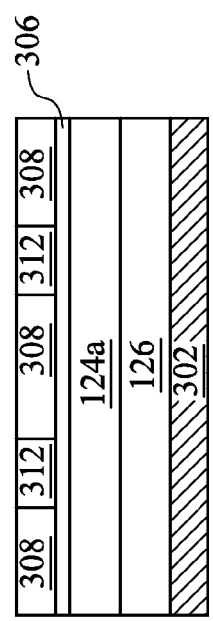
Fig. 4C
Fig. 4D
Fig. 3C
Fig. 3D

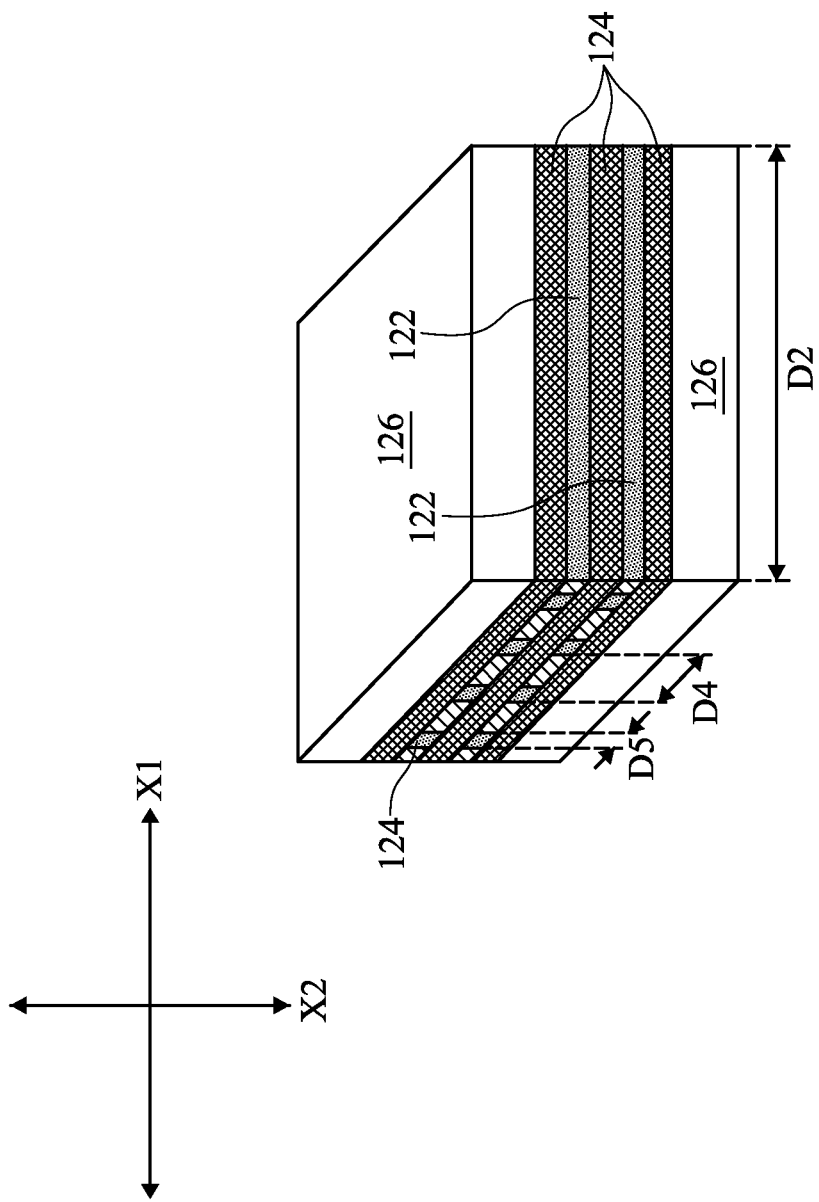

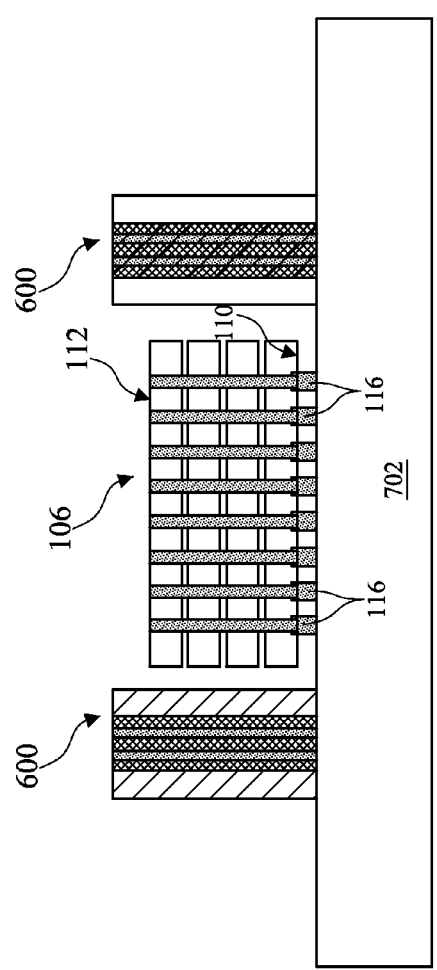
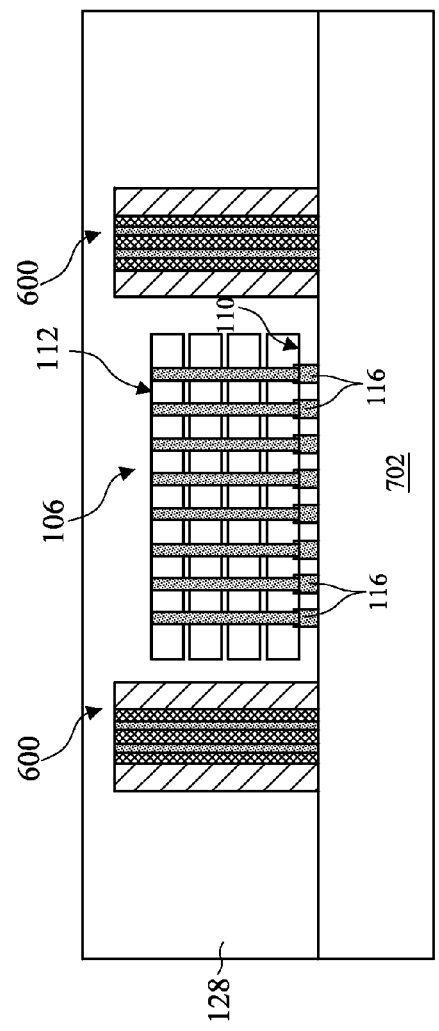
Fig. 7A
Fig. 7B

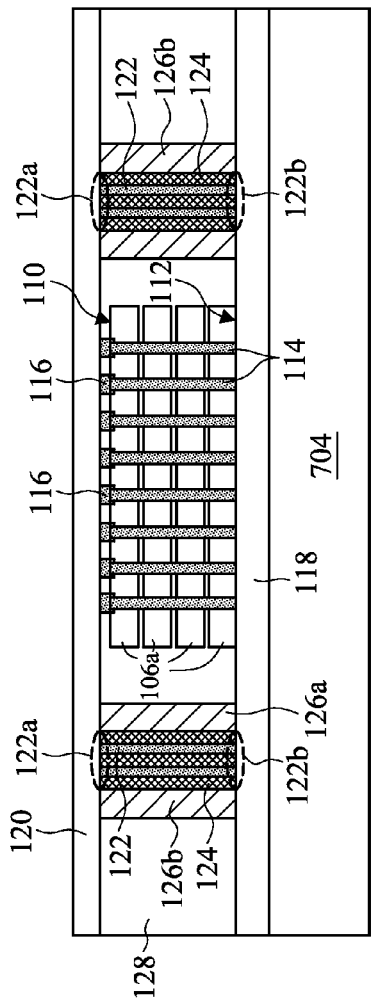
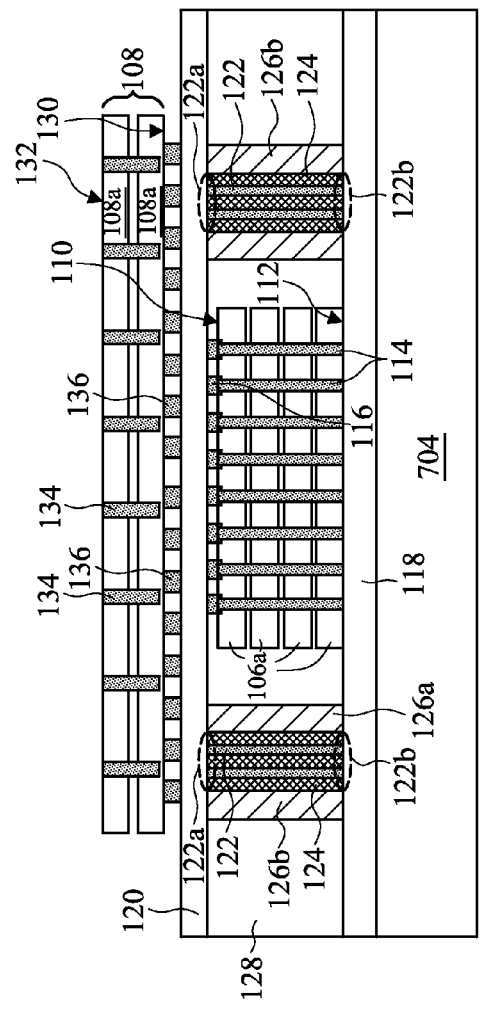
Fig. 7E
Fig. 7F

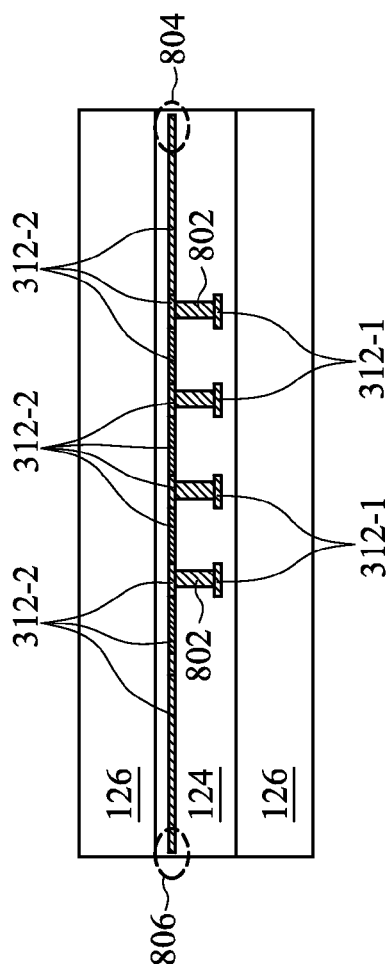
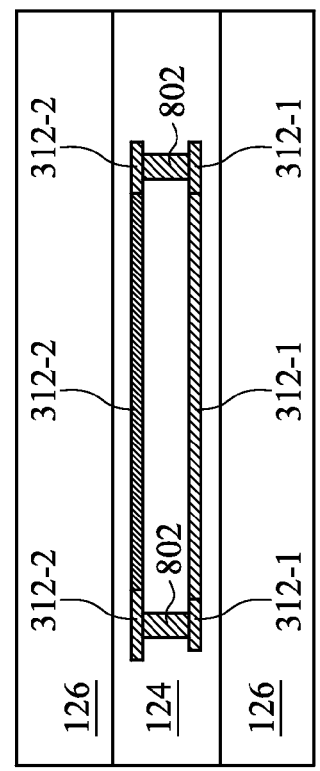
Fig. 9A
Fig. 9B

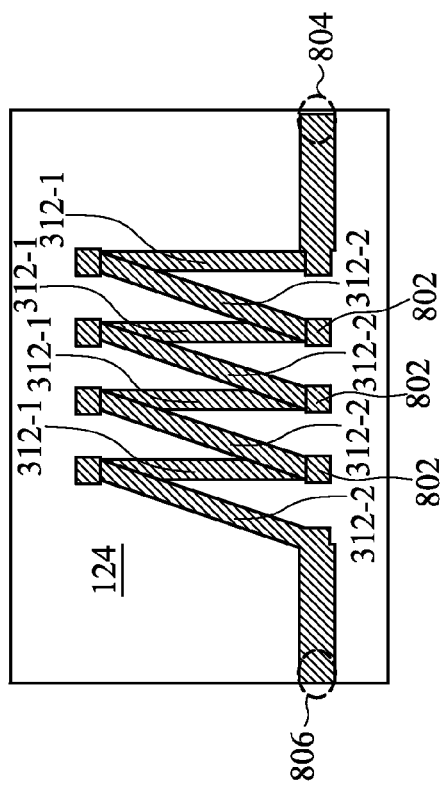
Fig. 9C
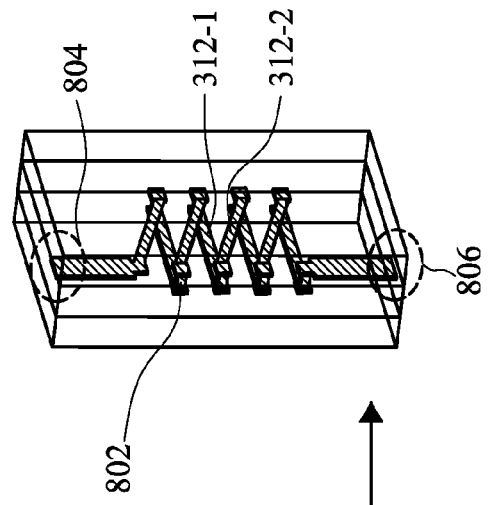
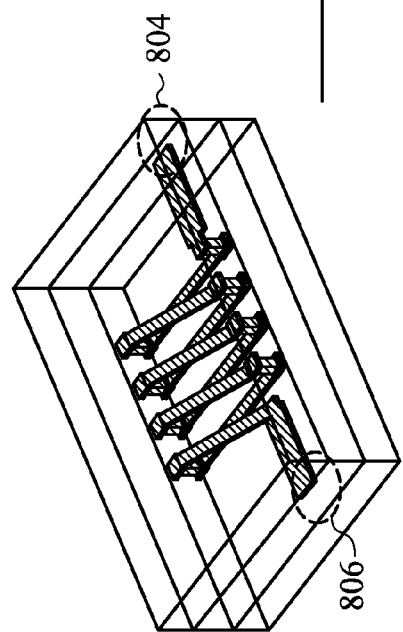
Fig. 9D

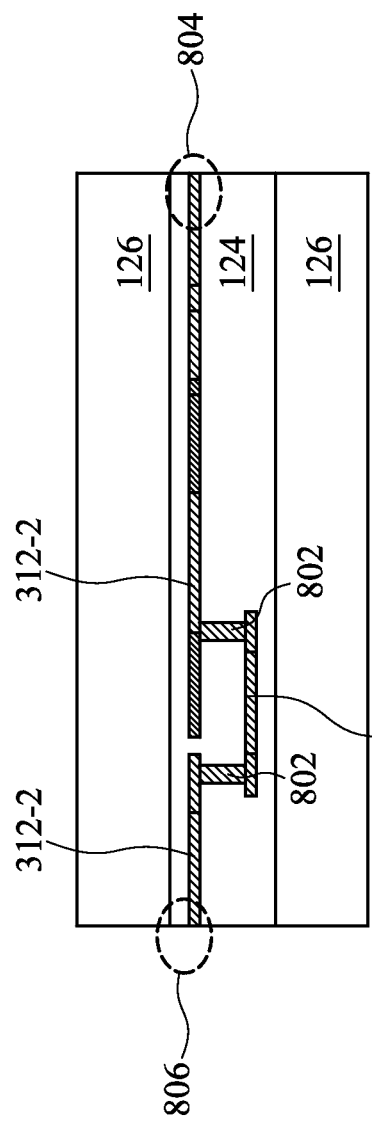
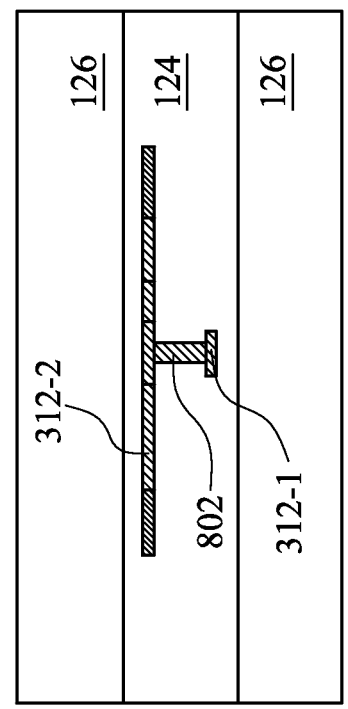
Fig. 11A
Fig. 11B

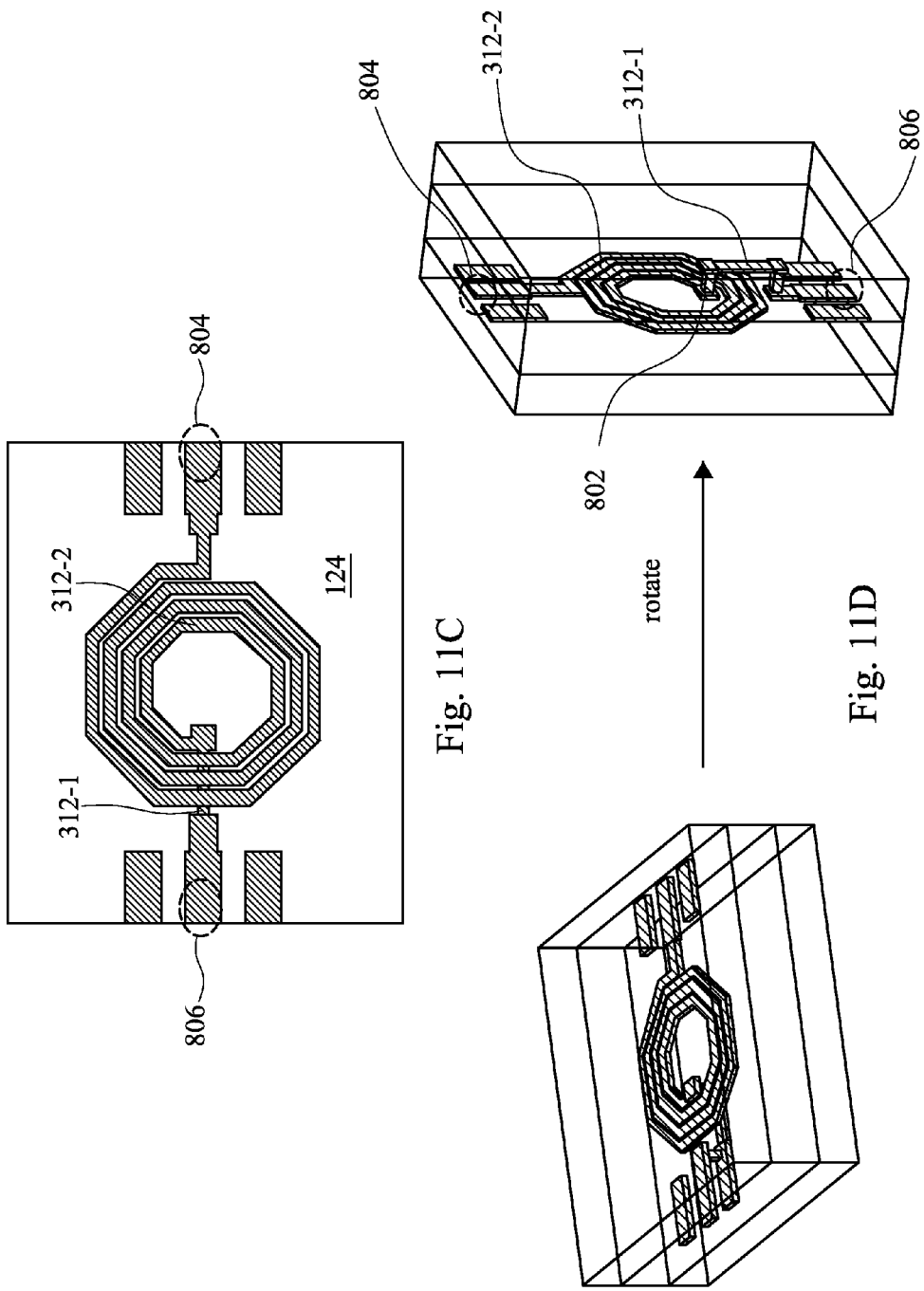

DIE PACKAGES AND METHODS OF MANUFACTURE THEREOF

BACKGROUND

In an aspect of packaging technologies, redistribution layers (RDLs) may be formed over a die and electrically connected to active devices in the die. Input/output (I/O) connectors such as solder balls on under-bump metallurgy (UBMs) may then be formed to electrically connect to the die through the RDLs. An advantageous feature of this packaging technology is the possibility of forming fan-out packages. Thus, the I/O pads on the die can be redistributed to cover a greater area than the die, and hence the number of I/O pads packed on the surfaces of the packaged dies can be increased.

Integrated Fan Out (InFO) package technology is becoming increasingly popular, particularly when combined with Wafer Level Packaging (WLP) technology. Such resulting package structures provide for high functional density with relatively low cost and high performance packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A to 3J show cross-sectional views of a method of manufacturing a plurality of vias encapsulated in a polymer layer and a molding compound, in accordance with an embodiment.

FIGS. 4A to 4J show corresponding top-down views of the method shown in FIGS. 3A to 3J, in accordance with an embodiment.

FIGS. 5 and 6 show perspective views of an encapsulated via structure comprising a plurality of vias encapsulated in a polymer layer and a molding compound, in accordance with an embodiment.

FIGS. 7A to 7H show a process flow illustrating some of the steps of a method of manufacturing the die package show in FIG. 1, in accordance with an embodiment.

FIGS. 9A to 9D show various views of the 3D inductor shown in FIG. 8, in accordance with an embodiment.

FIGS. 11A to 11D show various views of the spiral planar inductor shown in FIG. 10, in accordance with an embodiment.

DETAILED DESCRIPTION

Figure 1:
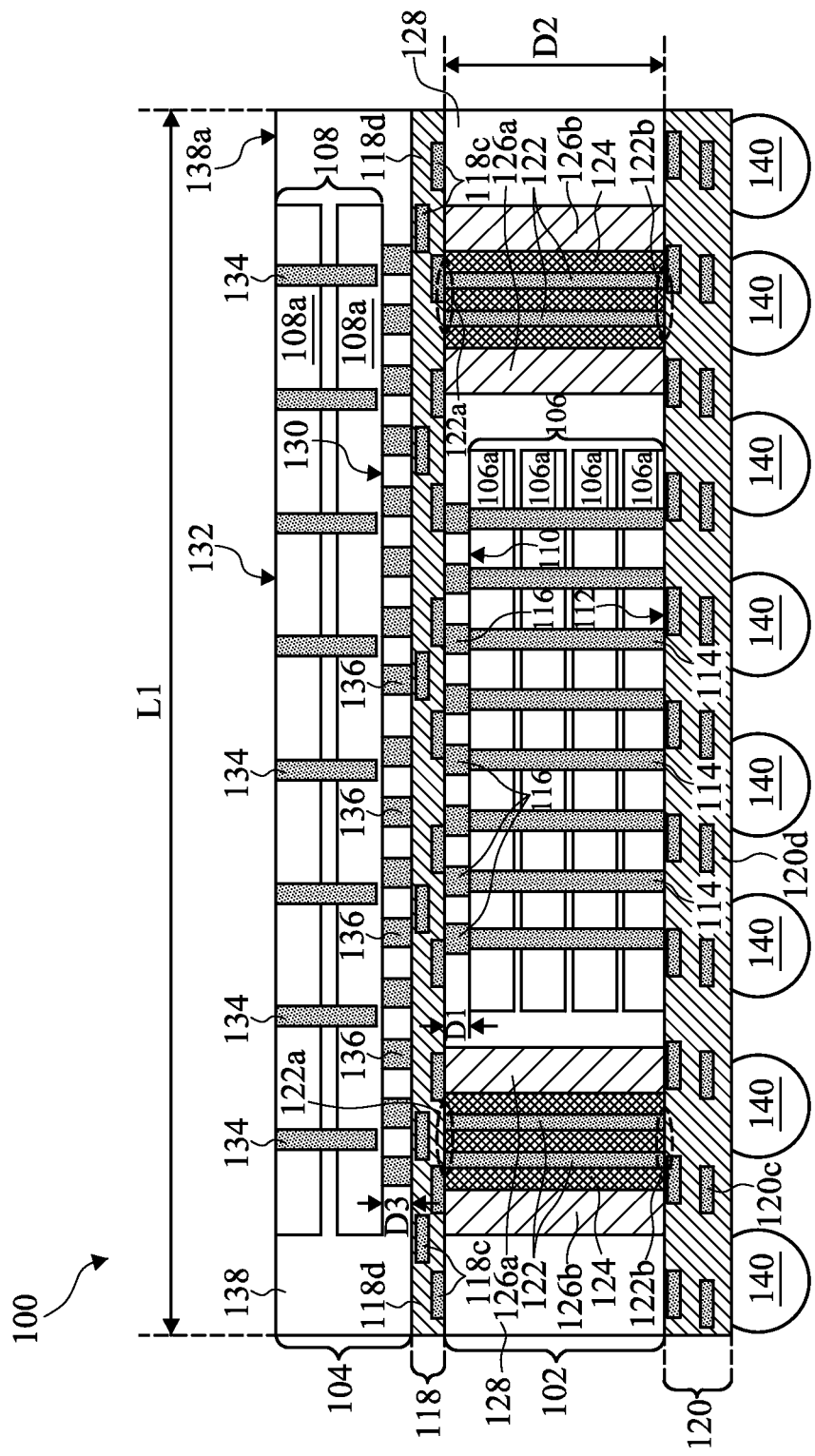
FIG. 1 shows a die package comprising a first die stack and a second die stack, in accordance with an embodiment.

The following disclosure provides many different embodiments, or examples, for implementing different features of the provided subject matter. Specific examples of components and stacks are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 shows a die package 100, in accordance with one or more embodiments. The die package 100 may, as an example, be an integrated fan-out (InFO) die package. The die package 100 may be a multi-level die package including a first die level 102 and a second die level 104 stacked over the first die level 102. The first die level 102 may include a first die stack 106, while the second die level 104 may include a second die stack 108. Consequently, the die package 100 may include a plurality of dies formed in the first die level 102 and the second die level 104, as shown in the embodiment of FIG. 1.

In the example of FIG. 1, the first die stack 106 comprises four stacked dies 106a; however, in another embodiment, the first die stack 106 may comprise more than four stacked dies 106a or less than four stacked dies 106a. In like manner, in the example of FIG. 1, the second die stack 108 comprises two stacked dies 108a; however, in another embodiment, the second die stack 108 may comprise one die 108a or more than two stacked dies 108a. Each of the dies 106a of the first die stack 106 and the dies 108a of the second die stack 108 may be a semiconductor die and could be any type of integrated circuit, examples of which include a processor, logic circuitry, memory, analog circuit, digital circuit, mixed signal, imaging device, MEMS device, a device used in power and/or communications applications, or the like. The dies 106a of the first die stack 106 and the dies 108a of the second die stack 108 may have been subjected to one or more functional tests (e.g. electrical connection and stress tests) and may have passed such functional tests. In such an example, each of the dies 106a and 108a may be a known good die (KGD).

The first die stack 106 may have a first surface 110 facing the second die stack 108. As an example, the first surface 110 may be a surface of the first die stack 106 in closest proximity to the second die stack 108. In the embodiment shown in FIG. 1, the first surface 110 of the first die stack 106 may be a topmost surface of the first die stack 106. The first die stack 106 may also have a second surface 112 opposite the first surface 110. The second surface 112 of the first die stack 106 may face away from the second die stack 108. As an example, the second surface 112 may be a surface of the first die stack 106 farthest from the second die stack 108. In the embodiment shown in FIG. 1, the second surface 112 of the first die stack 106 may be a bottommost surface of the first die stack 106.

Each of the dies 106a of the first die stack 106 may include a plurality of contact pads (not shown in FIG. 1), which may comprise an electrically conductive material (e.g. including aluminum, copper, or the like). The plurality of contact pads may function as input-output (I/O) features of the dies 106a of the first die stack 106, thereby enabling the dies 106a to be electrically connected to each other and/or to other features in the die package 100 or external to the die package 100. Each of the dies 106a of the first die stack 106 may additionally include passivation layers, dielectric layers, and under bump metallization (UBM) layers, which may be formed at the surfaces of the dies 106a having the plurality of contact pads. The passivation layers, dielectric layers, and under bump metallization (UBM) layers are not shown in FIG. 1 for the sake of simplicity.

In an embodiment, the first die stack 106 may comprise a plurality of first vias 114 disposed within (e.g. embedded within and/or extending through) at least one of the dies 106a of the first die stack 106. Only eight first vias 114 are shown in FIG. 1 as an example. However, in another example, the number of first vias 114 may be less than eight or may be more than eight first vias 114. The plurality of first vias 114 may be electrically connected to the contact pads of the dies 106a of the first die stack 106, thereby electrically connecting the dies 106a to each other. The plurality of first vias 114 may comprise an electrically conductive material such as copper, aluminum, tungsten, combinations thereof, or the like.

The die package 100 may also include a plurality of first conductive pillars 116 disposed in the first die level 102. Only eight first conductive pillars 116 are shown in FIG. 1 as an example. However, in another example, the number of first conductive pillars 116 may be less than eight or may be more than eight first conductive pillars 116. The plurality of first conductive pillars 116 may be arranged between the first die stack 106 and the second die stack 108. In some embodiments, such as in the example shown in FIG. 1, the plurality of first conductive pillars 116 may be disposed over and/or electrically connected to the plurality of first vias 114. In some embodiments, a respective conductive pillar of the plurality of first conductive pillars 116 may be disposed over a respective contact pad of the die 106a of the first die stack 106 in closest proximity to the second die stack 108. The plurality of first conductive pillars 116 may comprise similar materials as the plurality of first vias 114. Furthermore, each of the plurality of first conductive pillars 116 may have a first dimension D1, which may be in a range from about 5 micrometers to about 20 micrometers.

The die package 100 may include a first redistribution layer (RDL) 118 disposed between the first die level 102 and the second die level 104. The first RDL 118 may include conductive features 118c (e.g. conductive lines and vias) disposed between one or more first dielectric layers 118d. The conductive features 118c may comprise similar materials as the plurality of first vias 114, while the one or more first dielectric layers 118d may comprise a suitable dielectric material such as a polyimide, a polymer, an oxide (e.g. a silicon containing oxide, e.g. SiO), a nitride (e.g. a silicon containing nitride, e.g. SiN), an oxynitride (e.g. a silicon containing oxynitride), undoped silicate glass (USG), or the like. The one or more first dielectric layers 118d may be formed using spin-on coating, sputtering, or the like, and the conductive features 118c may be formed in the one or more first dielectric layers 118d by patterning the one or more first dielectric layers 118d (e.g. using a combination of photolithography and etching processes) and forming the conductive features 118c in the patterned one or more first dielectric layers 118d (e.g. by a damascene and/or dual damascene process). The conductive features 118c may be electrically connected to the dies 106a of the first die stack 106 through the plurality of first conductive pillars 116 and/or the plurality of first vias 114. Electrical connections from the plurality of first conductive pillars 116 may be fanned-out by the first RDL 118. Consequently, the first RDL 118 may also be referred to as a first fan-out structure.

The die package 100 may include a second redistribution layer (RDL) 120 disposed at the second surface 112 of the first die stack 106. The second RDL 120 may include conductive features 120c (e.g. conductive lines and vias) disposed between one or more second dielectric layers 120d. The conductive features 120c may comprise similar materials as the plurality of first vias 114, while the one or more second dielectric layers 120d may comprise similar materials as the first dielectric layers 118d. The one or more second dielectric layers 120d may be formed using similar processes described above in relation to the one or more first dielectric layers 118d, while the conductive features 120c of the second RDL 120 may be formed using similar processes described above in relation to the conductive features 118c of the first RDL 118. In some embodiments, at least one of the plurality of first vias 114 may be electrically connected to the conductive features 120c of the second RDL 120. Consequently, in such embodiments, the first RDL 118 and the second RDL 120 may be electrically connected to each other through the plurality of first conductive pillars 116 and the plurality of first vias 114.

The first RDL 118 and the second RDL 120 may, additionally or alternatively, be electrically connected to each other by a plurality of second vias 122 that extend between the first RDL 118 and the second RDL 120. In an embodiment, the plurality of second vias 122 may have a second dimension D2 (e.g. a height), which may be in a range from about 100 micrometers to about 300 micrometers (e.g. about 200 micrometers). The plurality of second vias 122 may be laterally separated from the first die stack 106, as shown in the example of FIG. 1. A first end 122a of the plurality of second vias 122 may be proximal the first RDL 118, while a second end 122b of the plurality of second vias 122 may be proximal the second RDL 120. The first end 122a of the plurality of second vias 122 may be electrically connected to the conductive features 118c of the first RDL 118, while the second end 122b of the plurality of second vias 122 may be electrically connected to the conductive features 120c of the second RDL 120, thereby electrically connecting the first RDL 118 and the second RDL 120 to each other. The plurality of second vias 122 may comprise similar materials as the plurality of first vias 114.

The plurality of second vias 122 may be encapsulated in a polymer layer 124, which may, in turn, be at least partially encapsulated in a first molding compound 126a, 126b. The first molding compound 126a, 126b may, as an example, provide structural and mechanical support to the polymer layer 124 as well as the plurality of second vias 122 disposed therein. As an example, the first molding compound 126a, 126b may comprise a first lateral portion 126a proximal the first die stack 106, and a second lateral portion 126b distal the first die stack 106. The plurality of second vias 122b and the polymer layer 124 may be disposed between the first lateral portion 126a and the second lateral portion 126b of the first molding compound 126a, 126b. In the description that follows the first lateral portion 126a and the second lateral portion 126b of the first molding compound 126a, 126b are collectively referred to as the first molding compound 126. The polymer layer 124 and the first molding compound 126 may differ in composition. As an example, the polymer layer 124 may comprise a material capable of functioning as a stress buffer, examples of which include at least one of polyimide (PI), polybenzoxazole (PBO), and one or more polymer materials available from JSR (Japanese Synthetic Rubber Co. Ltd., Tokyo, Japan), HDM (Hitachi-Dupont), an organic material (e.g. a carbon containing material), an epoxy-based material (e.g. a phenol-based epoxy), or the like. The first molding compound 126, on the other hand, may comprise a suitable material such as an epoxy resin, a molding underfill, or the like.

The polymer layer 124 may comprise a material that has a coefficient of thermal expansion (CTE) and/or a modulus of elasticity that is intermediate that of the first molding compound 126 and the plurality of second vias 122, thus reducing the mechanical and thermal stress formed between the plurality of second vias 122 and the first molding compound 126. As an example, the material of the polymer layer 124 may comprise a material having a modulus of elasticity in a range from about 0.5 GPa to about 5.0 GPa (e.g. about 2.1 GPa) below glass transition temperature. Accordingly, the material of the polymer layer 124 may be more compliant (e.g. less brittle or more pliable) compared to the first molding compound 126. As another example, the material of the polymer layer 124 may comprise a material having a CTE in a range from about 10 ppm/° C. to about 100 ppm/° C. (e.g. about 80 ppm/° C.) below glass transition temperature.

The die package 100 may further include a second molding compound 128 that encapsulates the first die stack 106 and fills gaps between the dies 106a of the first die stack 106, as shown in FIG. 1. The second molding compound 128 may additionally encapsulate the first molding compound 126. The second molding compound 128 may, as an example, provide structural and mechanical support to the first die level 102 as well as the features disposed therein (e.g. the first die stack 106). The second molding compound 128 may comprise similar materials as the first molding compound 126.

As shown in FIG. 1, the die package 100 includes the second die level 104 having the second die stack 108. The second die stack 108 may have a first surface 130 facing the first die stack 106. As an example, the first surface 130 may be a surface of the second die stack 108 in closest proximity to the first die stack 106. In the embodiment shown in FIG. 1, the first surface 130 of the second die stack 108 may be a bottommost surface of the second die stack 108. The second die stack 108 may also have a second surface 132 opposite the first surface 130. The second surface 132 of the second die stack 108 may face away from the first die stack 106. As an example, the second surface 132 may be a surface of the second die stack 108 farthest from the first die stack 106. In the embodiment shown in FIG. 1, the second surface 132 of the second die stack 108 may be a topmost surface of the second die stack 108.

Each of the dies 108a of the second die stack 108 may include a plurality of contact pads (not shown in FIG. 1), which may comprise an electrically conductive material (e.g. including aluminum, copper, or the like). The plurality of contact pads may function as input-output (I/O) features of the dies 108a of the second die stack 108, thereby enabling the dies 108a to be electrically connected to each other and/or to other features in the die package 100 or external to the die package 100. Each of the dies 108a of the second die stack 108 may additionally include passivation layers, dielectric layers, and under bump metallization (UBM) layers, which may be formed at the surfaces of the dies 108a having the plurality of contact pads. The passivation layers, dielectric layers, and under bump metallization (UBM) layers are not shown in FIG. 1 for the sake of simplicity.

In an embodiment, the second die stack 108 may comprise a plurality of third vias 134 disposed within (e.g. embedded within and/or extending through) at least one of the dies 108a of the second die stack 108. Only eight third vias 134 are shown in FIG. 1 as an example. However, in another example, the number of third vias 134 may be less than eight or may be more than eight third vias 134. The plurality of third vias 134 may be electrically connected to the contact pads of the dies 108a of the second die stack 108, thereby electrically connecting the dies 108a to each other. The plurality of third vias 134 may comprise similar materials as the plurality of first vias 114.

The die package 100 may also include a plurality of second conductive pillars 136 disposed in the second die level 104. The number of second conductive pillars 136 shown in FIG. 1 is merely illustrative and not meant to be limiting. The plurality of second conductive pillars 136 may be arranged between the second die stack 108 and the first RDL 118. In some embodiments, such as in the example shown in FIG. 1, the plurality of second conductive pillars 136 may be disposed over and/or electrically connected to the plurality of third vias 134. In some embodiments, a respective conductive pillar of the plurality of second conductive pillars 136 may be disposed over a respective contact pad of the die 108a of the second die stack 108 in closest proximity to the first die stack 106. The plurality of second conductive pillars 136 may comprise similar materials as the plurality of first vias 114. Furthermore, each of the plurality of second conductive pillars 136 may have a third dimension D3, which may be in a range from about 5 micrometers to about 20 micrometers. The conductive features 118c of the first RDL 118 may be electrically connected to the dies 108a of the second die stack 108 through the plurality of second conductive pillars 136 and/or the plurality of third vias 134. Electrical connections from the plurality of second conductive pillars 136 may be fanned-out by the first RDL 118.

The die package 100 may further include a third molding compound 138 that at least partially encapsulates the second die stack 108 and fills gaps between the dies 108a of the second die stack 106, as shown in FIG. 1. The third molding compound 138 may, as an example, provide structural and mechanical support to the second die level 104 as well as the features disposed therein (e.g. the second die stack 108). The third molding compound 138 may comprise similar materials as the first molding compound 126. In some embodiments, such as the example shown in FIG. 1, a surface 138a of the third molding compound 138 facing away from the first RDL 118 may be substantially co-planar with the second surface 132 of the second die stack 108. However, in another embodiment, the third molding compound 138 may be disposed over and may cover the second surface 132 of the second die stack 108.

The die package 100 may include a plurality of connectors 140 that may be disposed at a surface of the second RDL 120 facing away from the first die stack 106. Only eight connectors 140 are shown as an example, however, the number of connectors 140 may be less than eight (e.g. one, two, or three) or more than eight (e.g. nine, ten, or more) in accordance with some embodiments. The plurality of connectors 140 may be electrically connected to the conductive features 120c of the second RDL 120. Electrical connections to the die package 100 and the features formed therein (e.g. the first die stack 106 and/or the second die stack 108) may be accomplished using the plurality of connectors 140. The plurality of connectors 140 may comprise a ball grid array (BGA), controlled collapse chip connection (C4) bumps, or the like. The plurality of connectors 140 may comprise an electrically conductive material (e.g. a metal or metal alloy). For example, the plurality of connectors 140 may comprise a solder material. By way of another example, the plurality of connectors 140 may comprise at least one of tin, lead, copper, gold, silver, zinc, bismuth, magnesium, antimony, indium, an alloy thereof, or the like. In the example shown in FIG. 1, the each of the plurality of connectors 140 has a spherical shape (e.g. balls). However, in another embodiment the plurality of connectors 140 may have another shape, e.g. pillars, posts, bumps, or caps.

Figure 2:
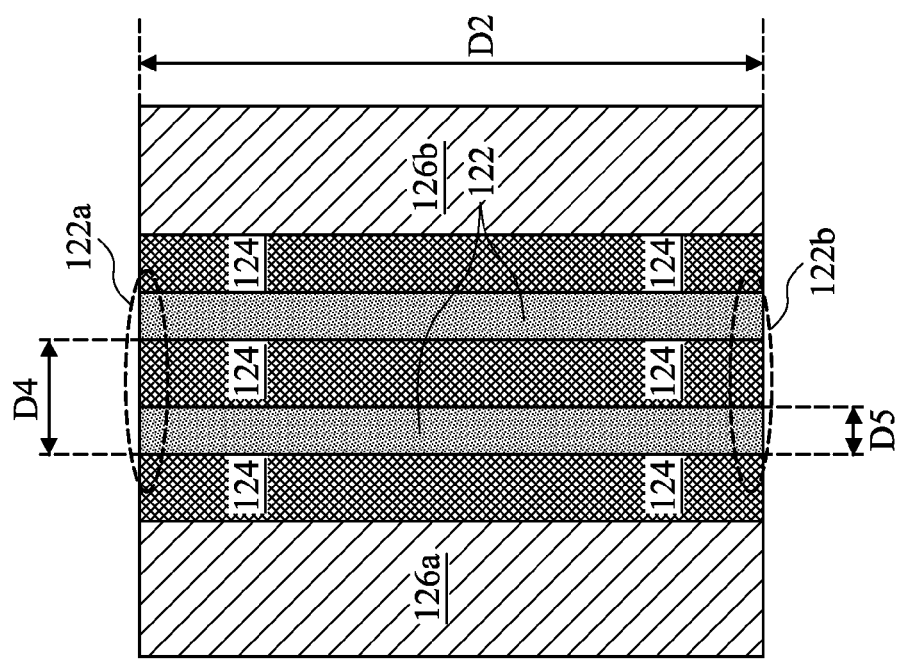
FIG. 2 shows an encapsulated via structure comprising a plurality of vias encapsulated in a polymer layer and a first molding compound, in accordance with an embodiment.

FIG. 2 shows the plurality of second vias 122, the polymer layer 124, and the first molding compound 126, in accordance with one or more embodiments. The structure shown in FIG. 2 may, as an example, be referred to as an encapsulated via structure. As described above in relation to FIG. 1, the first molding compound 126 may provide structural and mechanical support to the polymer layer 124 as well as the plurality of second vias 122 disposed therein. As illustrated in FIG. 2, adjacent vias (e.g. immediately adjacent vias) of the plurality of second vias 122 may be separated by a fourth dimension D4, which may be in a range from about 2 micrometer to about 10 micrometers (e.g. about 4 micrometers). This separation between adjacent vias of the plurality of second vias 122 may be finer than the separation observed between vias formed in a typical InFO package. The finer separation between adjacent vias of the plurality of second vias 122 may enable a lateral dimension L1 of the die package 100 to be smaller compared to a typical InFO package, thereby resulting in the die package 100 having a smaller form factor compared to a typical InFO package. As an example, the lateral dimension L1 of the die package 100 may be in a range from about 10 millimeters to about 20 millimeters. The finer separation between adjacent vias of the plurality of second vias 122 may be a result of a method used to manufacture the plurality of second vias 122, which is described below in respect of FIGS. 3A to 3J.

Furthermore, as shown in the example of FIG. 2, each of the plurality of second vias 122 may have a fifth dimension D5 (e.g. a width), which may be in a range from about 1 micrometer to about 3 micrometers (e.g. about 2 micrometers). The fifth dimension D5 may be substantially uniform along the second dimension D2 of the plurality of second vias 122. Illustratively, each of the plurality of second vias 122 may have the fifth dimension D5 at the first end 122a, at the second end 122b, and at portions of the second via 122 between the first end 122a and the second end 122b. Stated in another way, for each of the plurality of second vias 122, a variation of the fifth dimension D5 along the second dimension D2 may be negligible. This uniformity of the fifth dimension D5 along the second dimension D2 of each of the plurality of second vias 122 may result in a lower variation in resistance along the second dimension D2 of each of the plurality of second vias 122 compared to vias formed in a typical InFO package. This may result in better electrical performance of the die package 100 compared to a typical InFO package. The lower variation in resistance along the second dimension D2 of each of the plurality of second vias 122 may be a result of a method used to manufacture the plurality of second vias 122, which is described below in respect of FIGS. 3A to 3J.

Even further, as described above in respect of FIG. 1, each of the plurality of second vias 122 may have the second dimension D2, which may be in a range from about 100 micrometers to about 300 micrometers (e.g. about 200 micrometers). Consequently, a ratio of the second dimension D2 to the fifth dimension D5 (which may be in a range from about 1 micrometer to about 10 micrometers) may be in a range from about 10:1 to about 300:1. In vias formed in a typical InFO package, such a ratio may be in a range from about 2:1 to about 3:1. Accordingly, each of the plurality of second vias 122 may have a higher aspect ratio compared to vias formed in a typical InFO package. The higher aspect ratio of the plurality of second vias 122 may be a result of a method used to manufacture the plurality of second vias 122, which is described below in respect of FIGS. 3A to 3J.

FIGS. 3A to 3J show cross-sectional views of a method of manufacturing the plurality of second vias 122 encapsulated in the polymer layer 124 and the first molding compound 126, in accordance with one or more embodiments. FIGS. 4A to 4L show corresponding top-down views of the method shown in FIGS. 3A to 3J taken along a line A-A' shown in FIG. 3A, in accordance with one or more embodiments. As an example, the cross-sectional views shown in FIGS. 3A to 3J may be taken along a line B-B' shown in FIG. 4A.

Figure 4A:
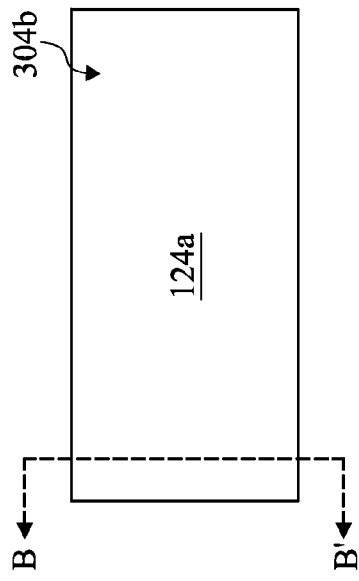
Figure 3A:
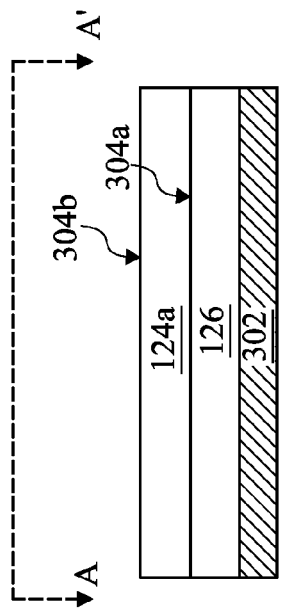

Referring to FIGS. 3A and 4A, the first molding compound 126 may be formed on or over a first carrier 302, and a first layer 124a of the polymer layer 124 may be formed over the first molding compound 126. The first carrier 302 provides temporary mechanical and structural support to the features that are formed during subsequent processing steps. The first carrier 302 may include, for example, glass, silicon, silicon oxide, aluminum oxide, and the like. The first carrier 302 may, as an example, be a carrier wafer. The first molding compound 126 formed in the step illustrated in FIG. 3A may, as an example, be identified with the first lateral portion 126a or the second lateral portion 126b of the first molding compound 126. In some embodiments, the first molding compound 126 is shaped or molded over the first carrier 302 using, for example, a mold (not shown) which may have a border or other feature for retaining the first molding compound 126 when applied. Such a mold may be used to pressure mold the first molding compound 126 over the first carrier 302. In some embodiments, an etching process and/or a planarization process, such as a mechanical grinding process or a chemical mechanical polishing (CMP) process may be performed on the first molding compound 126 in order to form a surface 304a of the first molding compound 126 that is substantially planar. The first layer 124a of the polymer layer 124 may subsequently be formed over the first molding compound 126 using a suitable process, such as spin-on coating, chemical vapor deposition (CVD), plasma enhanced chemical vapor deposition (PECVD), or the like. In some embodiments, an etching process and/or a planarization process, such as a mechanical grinding process or a chemical mechanical polishing (CMP) process may be performed on the first layer 124a of the polymer layer 124 in order to form a surface 304b of the first layer 124a of the polymer layer 124 that is substantially planar.

Figure 4B:
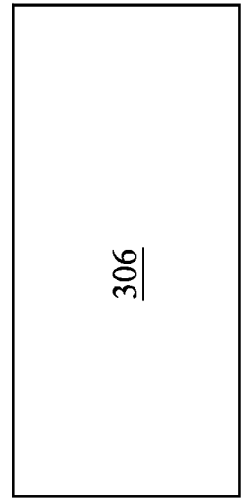
Figure 3B:
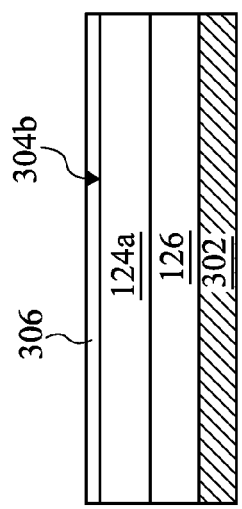

Referring to FIGS. 3B and 4B, a seed layer 306 may be formed on or over the surface 304b of the first layer 124a of the polymer layer 124. The seed layer 306 may be formed using a suitable deposition process such as CVD, PECVD, atomic layer deposition (ALD), or the like. The seed layer 306 may comprise a conductive material, such as titanium, copper, aluminum, combinations thereof, or the like.

Referring to FIGS. 3C and 4C, a patterned photoresist 308 may be formed over the seed layer 306. The patterned photoresist 308 may have a plurality of openings 310 formed therein. The patterned photoresist 308 may be formed by depositing a first photoresist over the seed layer 306 and subsequently patterning the first photoresist to form the plurality of openings 310 that expose portions of the seed layer 306. The first photoresist may comprise one or more suitable photosensitive materials and may be deposited over the seed layer 306 using spin-on coating, CVD, PECVD, ALD, or the like. The first photoresist may be patterned using, for example, a lithographic process (e.g. a photo-lithographic process). In an embodiment, each of the plurality of openings 310 may have a sixth dimension D6, which may be substantially equal to the second dimension D2 of the plurality of second vias 122. As an example, the sixth dimension D6 may be a length of each of the plurality of openings 310. Additionally, adjacent openings (e.g. immediately adjacent openings 310) of the plurality of openings 310 may be separated by a seventh dimension D7, which may be substantially equal to the fourth dimension D4 of the plurality of second vias 122. Even further, each of the plurality of openings 310 may have an eighth dimension D8, which may be substantially equal to the fifth dimension D5 of the plurality of second vias 122. As an example, the eighth dimension D8 may be a width of each of the plurality of openings 310.

Referring to FIGS. 3D and 4D, the process flow continues with the formation of a first layer of conductive material 312 in the plurality of openings 310. The first layer of conductive material 312 may comprise similar materials as the plurality of second vias 122. The first layer of conductive material 312 may be formed by any suitable techniques, examples of which include electroplating, sputtering, evaporation, PECVD and/or the like. In some embodiments, the first layer of conductive material 312 may overfill the plurality of openings 310. This may result in portions of the first layer of conductive material 312 extending over the patterned photoresist 308. In such an embodiment, a planarization process, such as a chemical mechanical polish (CMP) or an etch back process, may be used to remove portions of the first layer of conductive material 312 disposed outside the plurality of openings 310 in order that surfaces of the first layer of conductive material 312 and the patterned photoresist 308 be substantially co-planar, as shown in FIG. 3D.

Figure 4E:
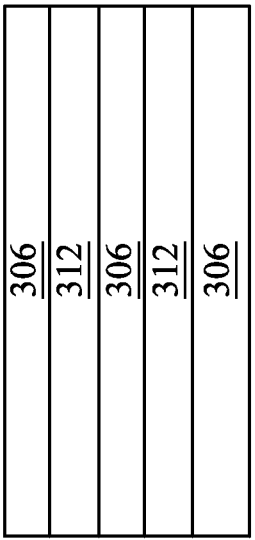
Figure 3E:
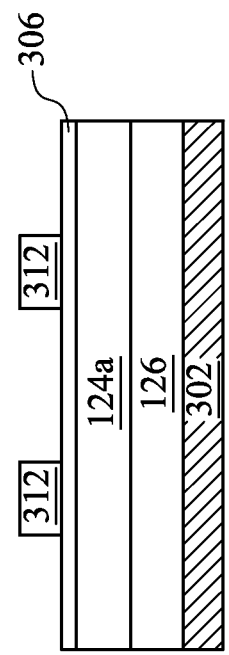

Referring to FIGS. 3E and 4E, the patterned photoresist 308 may subsequently be removed to expose sidewalls of the first layer of conductive material 312 and the seed layer 306. The patterned photoresist 308 may be removed using suitable processes such as a stripping process (e.g. a wet strip process) or an etching process (e.g. plasma etching process) that leaves the first layer of conductive material 312 substantially unperturbed.

Figure 4F:
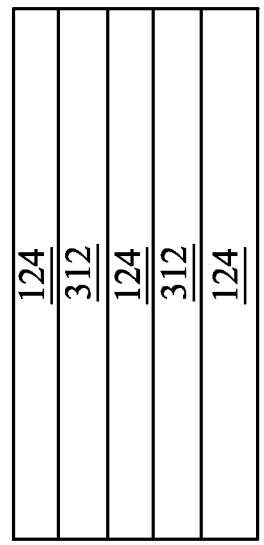
Figure 3F:
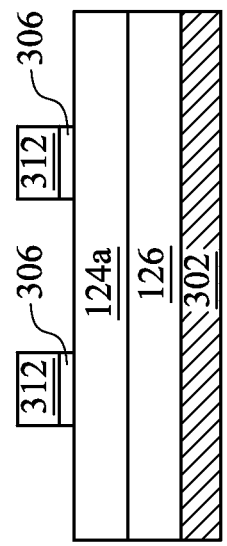

Referring to FIGS. 3F and 4F, the process flow may continue with the removal of exposed portions of the seed layer 306, which may be accomplished by an etching process or the like. This step of the process flow may expose portions of the first layer 124a of the polymer layer 124 that are not covered by the first layer of conductive material 312.

Figure 4G:
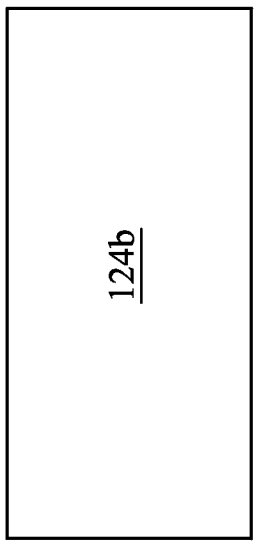
Figure 4H:
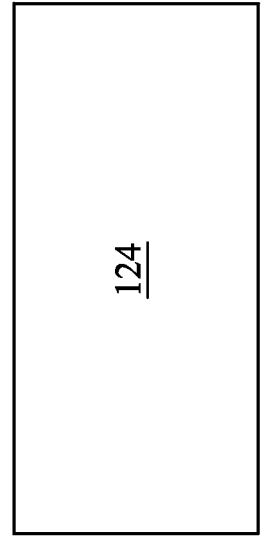
Figure 3G:
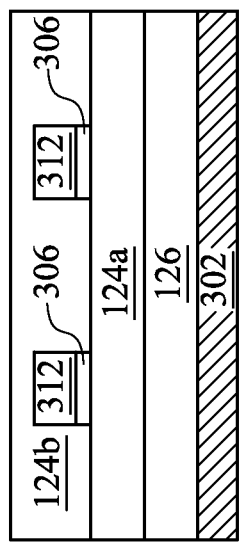

Referring to FIGS. 3G and 4G, a second layer 124b of the polymer layer 124 may be formed over the first layer 124a of conductive material 312 to encapsulate (e.g. completely encapsulate) the first layer of conductive material 312. The second layer 124b of the polymer layer 124 may be formed using similar process described above in relation to the first layer 124a of the polymer layer 124.

Figure 3H:
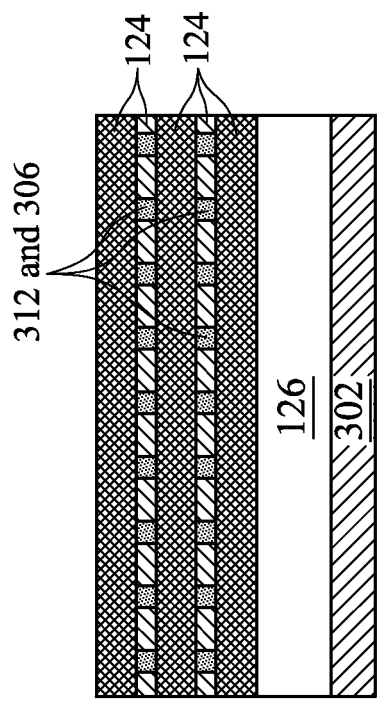

The process flow may continue with one or more repetitions of the steps shown in FIGS. 3B to 3G, e.g. in order to form a structure similar to that shown in FIG. 3H, where a plurality of layers of conductive material 312 is encapsulated in a plurality of layers of the polymer layer 124. In the example shown in FIG. 3G, only two layers of conductive material 312 and two layers of the polymer layer 124 are shown; however, in other embodiments, more than two layers of conductive material 312 and more than two layers of the polymer layer 124 may be formed. The plurality of layers of conductive material 312 may, as an example, be identified with the plurality of second vias 122 shown in FIG. 1, while the plurality of layers of the polymer layer 124 may be identified with the polymer layer 124 shown in FIG. 1 that encapsulates the plurality of second vias 122.

Figure 3I:
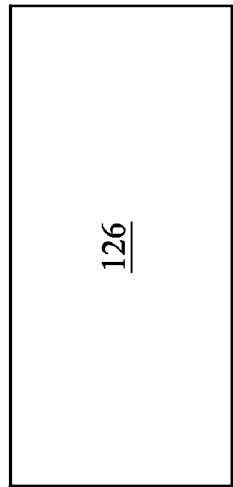
Figure 4I:
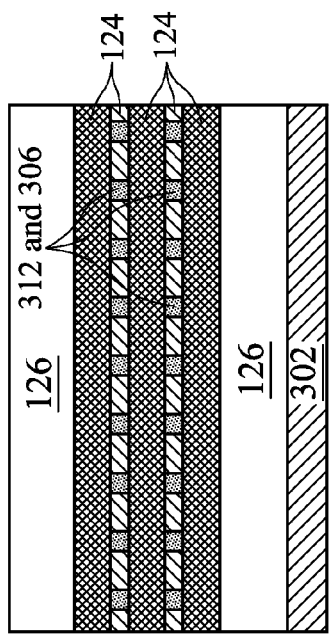

Referring to FIGS. 3I and 4I, the process flow may continue with the formation of the first molding compound 126 over the structure shown in FIG. 3H where the plurality of layers of conductive material 312 is encapsulated in the plurality of layers of the polymer layer 124. The first molding compound 126 shown in FIGS. 3I and 4I may be formed using similar processes described above in relation to the first molding compound 126 in FIG. 3A. The first molding compound 126 formed in the step illustrated in FIG. 3I may, as an example, be identified with the first lateral portion 126a or the second lateral portion 126b of the first molding compound 126.

Figure 3J:
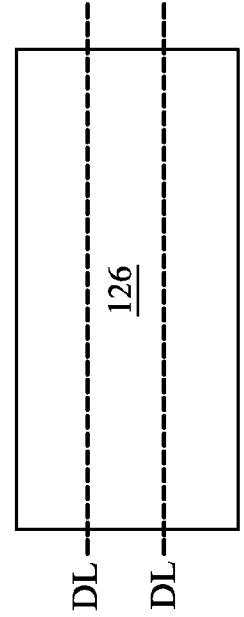
Figure 4J:
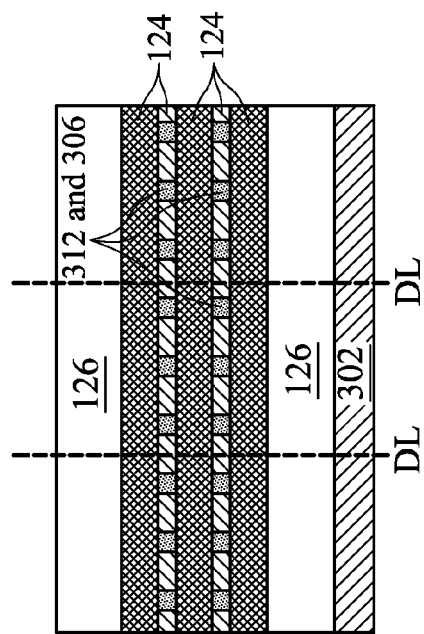

Referring to FIGS. 3J and 4J, the structure shown in FIGS. 3I and 4I may be debonded or demounted from the first carrier 302 and subsequently singulated or diced (e.g. along dicing lines DL), thereby forming a plurality of structures where the plurality of second vias 122 is encapsulated in the polymer layer 124 and the first molding compound 126. An example of such a structure is shown in FIG. 5, which shows a perspective view of the plurality of second vias 122 is encapsulated in the polymer layer 124 and the first molding compound 126, in accordance with one or more embodiments. In the example shown in FIG. 5, following the singulation or dicing, the second dimension D2 of the plurality of second vias 122 may extend in a direction substantially parallel to a first axis X1 (e.g. a horizontal axis or an X-axis). In some embodiments, the structure shown in FIG. 5 may be rotated such that the second dimension D2 of the plurality of second vias 122 extends in a direction substantially parallel to a second axis X2 (e.g. a vertical axis or a Z-axis). The second axis X2 may be substantially perpendicular to the first axis X1. The rotation may be performed by a pick-and-place machine, a SMT (surface mount technology) component placement system, or the like. The result of the rotation is the encapsulated via structure 600 shown in FIG. 6.

As a result of the process flow shown in FIGS. 3A to 3J, a finer separation between adjacent vias of the plurality of second vias 122 is achieved in comparison with a typical InFO package. Furthermore, as a result of the process flow shown in FIGS. 3A to 3J, a lower variation in resistance along the second dimension D2 of each of the plurality of second vias 122 is achieved in comparison with a typical InFO package. Even further, as a result of the process flow shown in FIGS. 3A to 3J, higher aspect ratio of the plurality of second vias 122 in comparison with a typical InFO package.

Figure 6:
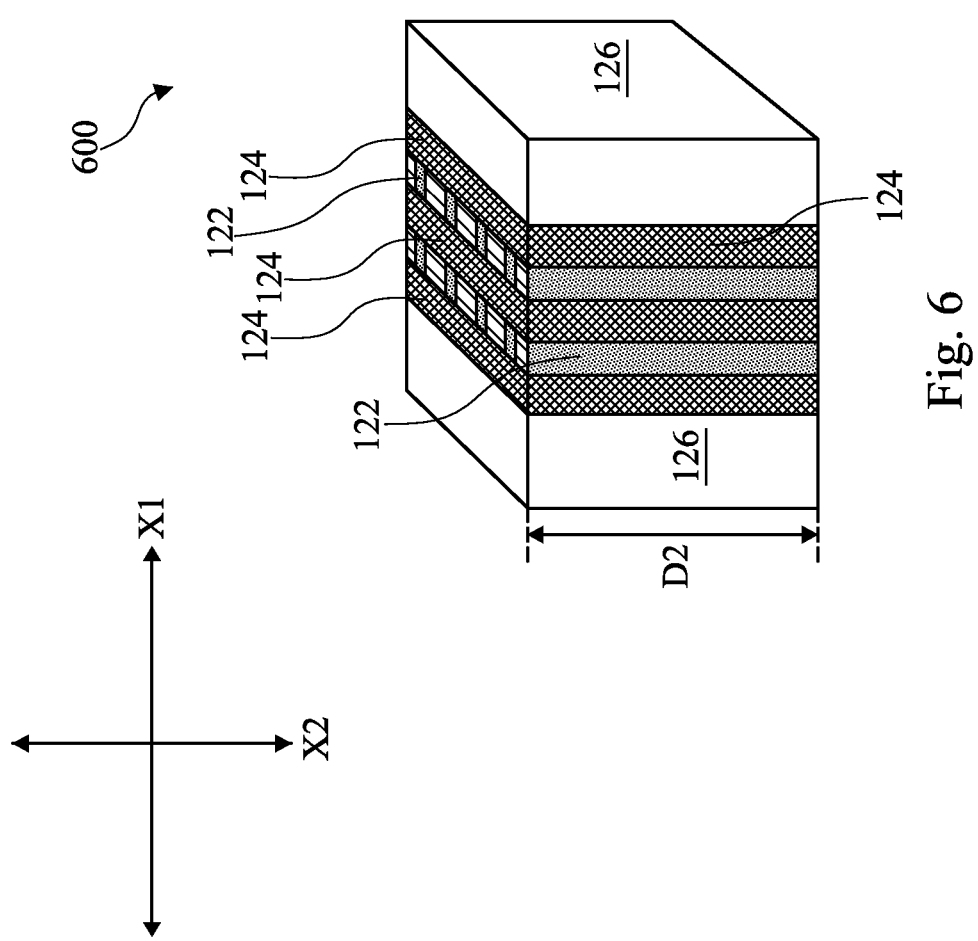
Figure 7C:
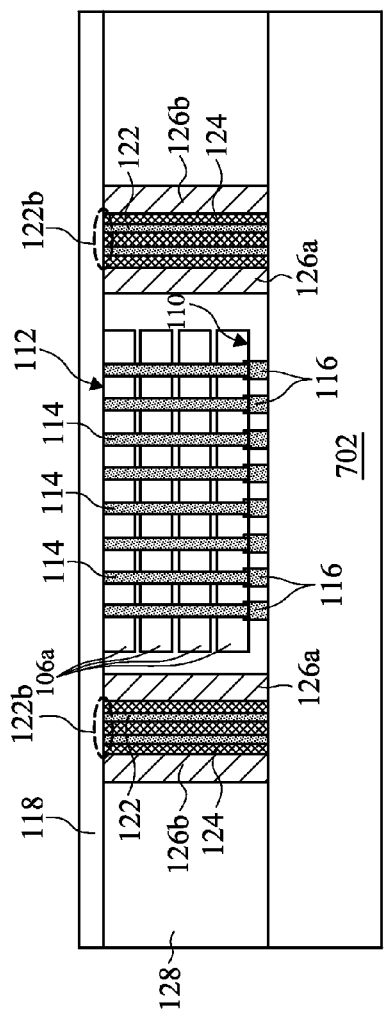

The encapsulated via structure 600 shown in FIG. 6 may subsequently be used in the manufacture of the die package 100 shown in FIG. 1. FIGS. 7A to 7H show a process flow illustrating some of the steps of a method of manufacturing the die package 100, in accordance with one or more embodiments. Referring to FIG. 7A, the encapsulated via structure 600 and the first die stack 106 may be placed (e.g. picked and placed) over a second carrier 702. As shown in the example of FIG. 7A, the plurality of second vias 122 extend away from the second carrier 702. In some embodiments, an adhesive layer (not shown in FIG. 7A) may be disposed over the second carrier 702 and may aid in securing the first die stack 106 and the encapsulated via structure 600 to the second carrier 702. The second carrier 702 may comprise similar materials and may fulfill a similar function as the first carrier 302. In some embodiments, as in the example shown in FIG. 7A, the first surface 110 of the first die stack 106 may face the second carrier 702, while the second surface 112 of the first die stack 106 may face way from the second carrier 702. As shown in the example of FIG. 7A, the plurality of first conductive pillars 116 may be disposed between the first surface 110 of the first die stack 106 and the second carrier 702.

Referring to FIG. 7B, the second molding compound 128 may be formed over and may encapsulate (e.g. fully encapsulate) the encapsulated via structure 600 and the first die stack 106. In some embodiments, the second molding compound 128 is shaped or molded using for example, a mold (not shown) which may have a border or other feature for retaining the second molding compound 128 when applied. Such a mold may be used to pressure mold the second molding compound 128 over and around the first die stack 106 and the encapsulated via structure 600 to force the second molding compound 128 into openings and recesses, eliminating air pockets or the like in the second molding compound 128.

Referring to FIG. 7C, a thinning process (e.g. etching process and/or a planarization process, such as a mechanical grinding process or a chemical mechanical polishing (CMP) process) may be performed on the second molding compound 128 to expose the second surface 112 of the first die stack 106, the plurality of first vias 114, and the second end 122b of the plurality of second vias 122. Subsequently, the first RDL 118 may be formed over the encapsulated via structure 600, the second surface 112 of the first die stack 106, and the second molding compound 128 using one or more of the processes described above in relation to FIG. 1. The conductive features 118c of the first RDL 118 may be coupled (e.g. electrically and/or physically coupled) to the plurality of first vias 114 and/or the plurality of second vias 122. The conductive features 118c of the first RDL 118 are omitted from FIG. 7C for the sake of clarity.

Figure 7D:
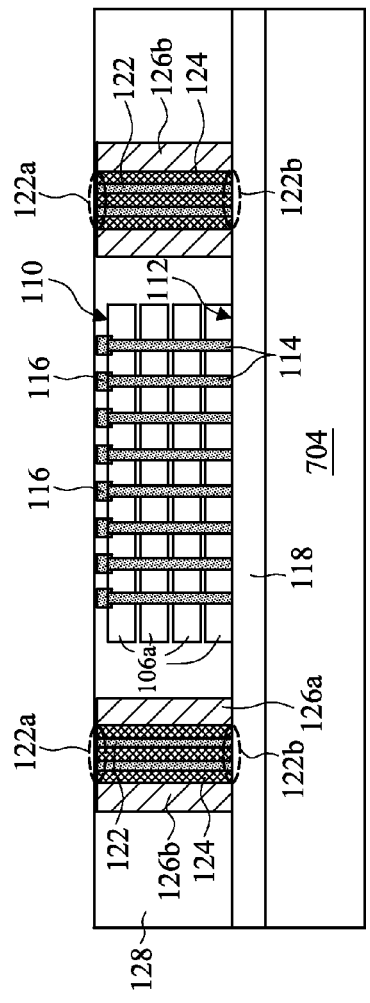

Referring to FIG. 7D, the second carrier 702 may be inverted and the first RDL 118 may be bonded or mounted onto a third carrier 704. Additionally, the second carrier 702 may be debonded from the second molding compound 128, the encapsulated via structure 600, and the plurality of first conductive pillars 116. A thermal debonding process or a laser debonding process may be utilized to debond the second carrier 702. The third carrier 704 may comprise similar materials and may fulfill similar functions as the second carrier 702.

Referring to FIG. 7E, another thinning process (e.g. etching process and/or a planarization process, such as a mechanical grinding process or a chemical mechanical polishing (CMP) process) may be performed to expose the first end 122a of the plurality of second vias 122 and the plurality of first conductive pillars 116. Subsequently, the second RDL 120 may be formed over the encapsulated via structure 600, the plurality of first conductive pillars 116, and the second molding compound 128 using one or more of the processes described above in relation to FIG. 1. The conductive features 120c of the second RDL 120 may be coupled (e.g. electrically and/or physically coupled) to the plurality of first conductive pillars 116 and/or the plurality of second vias 122. The conductive features 120c of the second RDL 120 are omitted from FIG. 7D for the sake of clarity.

Referring to FIG. 7F, the second die stack 108 may be placed (e.g. picked and placed) over the second RDL 120. As shown in FIG. 7F, the plurality of second conductive pillars 136 may be disposed between the second die stack 108 and the second RDL 120. In an embodiment, the plurality of second conductive pillars 136 may be formed at the first surface 130 of the second die stack 108. Subsequently, the second die stack 108 having the plurality of second conductive pillars 136 may be placed over the second RDL 120. The plurality of second conductive pillars 136 may be electrically coupled to the conductive features 120c of the second RDL 120.

Figure 7G:
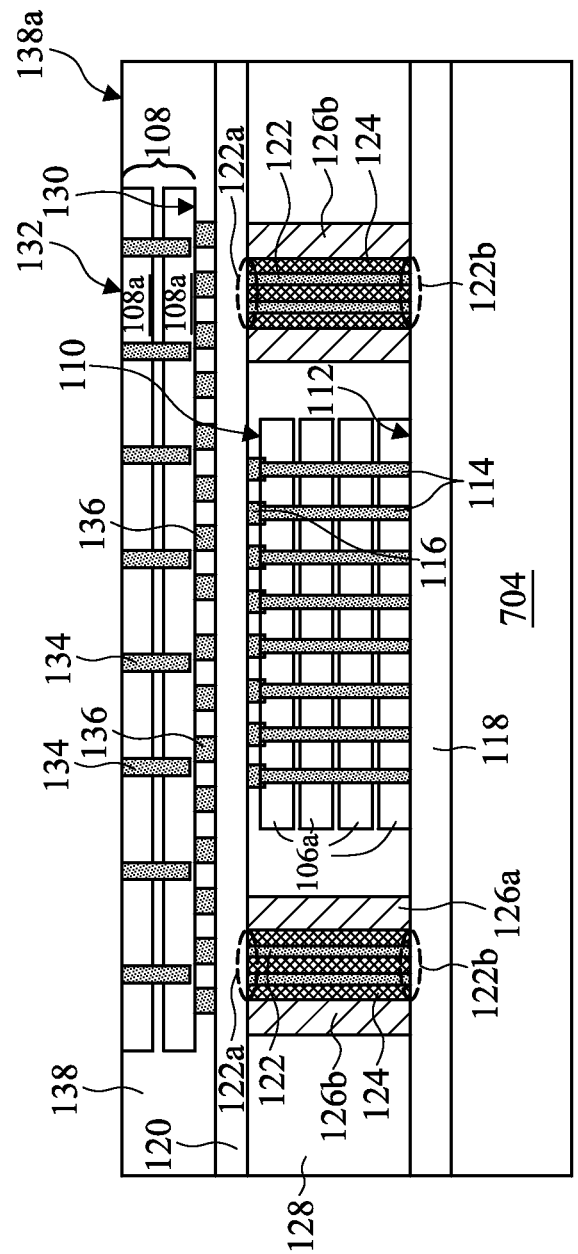

Referring to FIG. 7G, the third molding compound 138 may be formed over and may encapsulate (e.g. fully encapsulate) the second die stack 108. In some embodiments, the third molding compound 138 is shaped or molded using for example, a mold (not shown) which may have a border or other feature for retaining the third molding compound 138 when applied. Such a mold may be used to pressure mold the third molding compound 138 over and around the second die stack 108 to force the third molding compound 138 into openings and recesses, eliminating air pockets or the like in the third molding compound 138. In some embodiments, such as the example shown in FIG. 7G, yet another thinning process (e.g. etching process and/or a planarization process, such as a mechanical grinding process or a chemical mechanical polishing (CMP) process) may be performed to expose the second surface 132 of the second die stack 108, such that the second surface 132 of the second die stack 108 and the surface 138a of the third molding compound 138 are substantially co-planar.

Figure 7H:
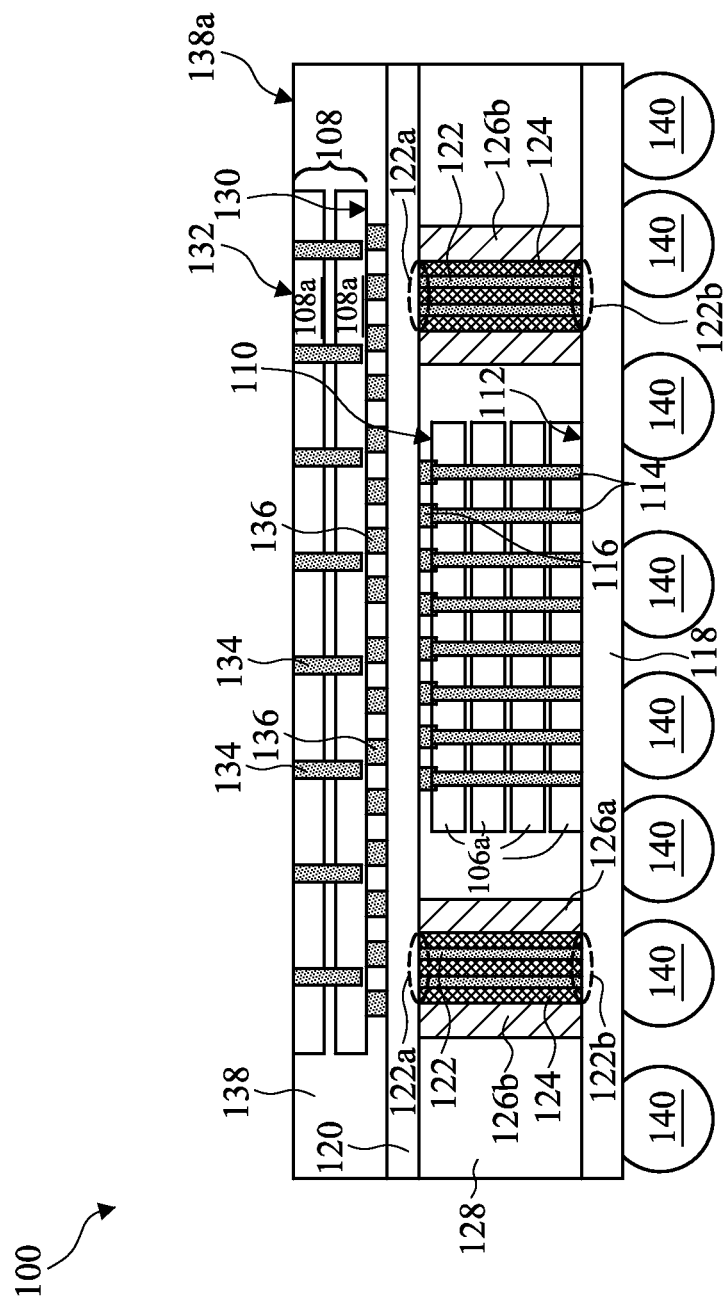

Referring to FIG. 7H, the process flow may continue with the formation of the plurality of connectors 140 at the surface of the first RDL 118 facing away from the first die stack 106. This may be accomplished by debonding the third carrier 704 from the first RDL 118. Some of the conductive features 118c of the first RDL 118 may be exposed (e.g. by a laser opening process and/or etching process), and the plurality of connectors 140 may thereafter be formed over the exposed conductive features 118c of the first RDL 118 (e.g. by a BGA mounting process).

In the process flow shown in FIGS. 7A to 7H, adjacent vias (e.g. immediately adjacent vias) of the plurality of second vias 122 may be separated by the fourth dimension D4, which may be in a range from about 2 micrometer to about 10 micrometers (e.g. about 4 micrometers). This separation between adjacent vias of the plurality of second vias 122 may be finer than the separation observed between vias formed in a typical InFO package. The finer separation between adjacent vias of the plurality of second vias 122 may enable a lateral dimension L1 of the die package 100 to be smaller compared to a typical InFO package, thereby resulting in the die package 100 having a smaller form factor compared to a typical InFO package. The finer separation between adjacent vias of the plurality of second vias 122 may be a result of a method used to manufacture the plurality of second vias 122, which is described below in respect of FIGS. 3A to 3J.

Furthermore, as shown in the example of FIG. 2, each of the plurality of second vias 122 may have a fifth dimension D5 (e.g. a width), which may be in a range from about 1 micrometer to about 3 micrometers (e.g. about 2 micrometers). The fifth dimension D5 may be substantially uniform along the second dimension D2 of the plurality of second vias 122. Illustratively, each of the plurality of second vias 122 may have the fifth dimension D5 at the first end 122a, at the second end 122b, and at portions of the second via 122 between the first end 122a and the second end 122b. Stated in another way, for each of the plurality of second vias 122, a variation of the fifth dimension D5 along the second dimension D2 may be negligible. This uniformity of the fifth dimension D5 along the second dimension D2 of each of the plurality of second vias 122 may result in a lower variation in resistance along the second dimension D2 of each of the plurality of second vias 122 compared to vias formed in a typical InFO package. This may result in better electrical performance of the die package 100 compared to a typical InFO package. The lower variation in resistance along the second dimension D2 of each of the plurality of second vias 122 may be a result of a method used to manufacture the plurality of second vias 122, which is described below in respect of FIGS. 3A to 3J.

Even further, as described above in respect of FIG. 1, each of the plurality of second vias 122 may have the second dimension D2, which may be in a range from about 100 micrometers to about 300 micrometers (e.g. about 200 micrometers). Consequently, a ratio of the second dimension D2 to the fifth dimension D5 (which may be in a range from about 1 micrometer to about 3 micrometers) may be in a range from about 30:1 to about 300:1. In vias formed in a typical InFO package, such a ratio may be in a range from about 2:1 to about 3:1. Accordingly, each of the plurality of second vias 122 may have a higher aspect ratio compared to vias formed in a typical InFO package. The higher aspect ratio of the plurality of second vias 122 may be a result of a method used to manufacture the plurality of second vias 122, which is described below in respect of FIGS. 3A to 3J.

In the examples presented above, the method shown in FIGS. 3A to 3J may be used to form the plurality of second vias 122 that are encapsulated in the polymer layer 124 and the first molding compound 126. However, in another embodiment, the method shown in FIGS. 3A to 3J may be used to form passive devices having a small form factor, and such passive devices may be included in the die package 100 shown in FIG. 1.

Figure 8:
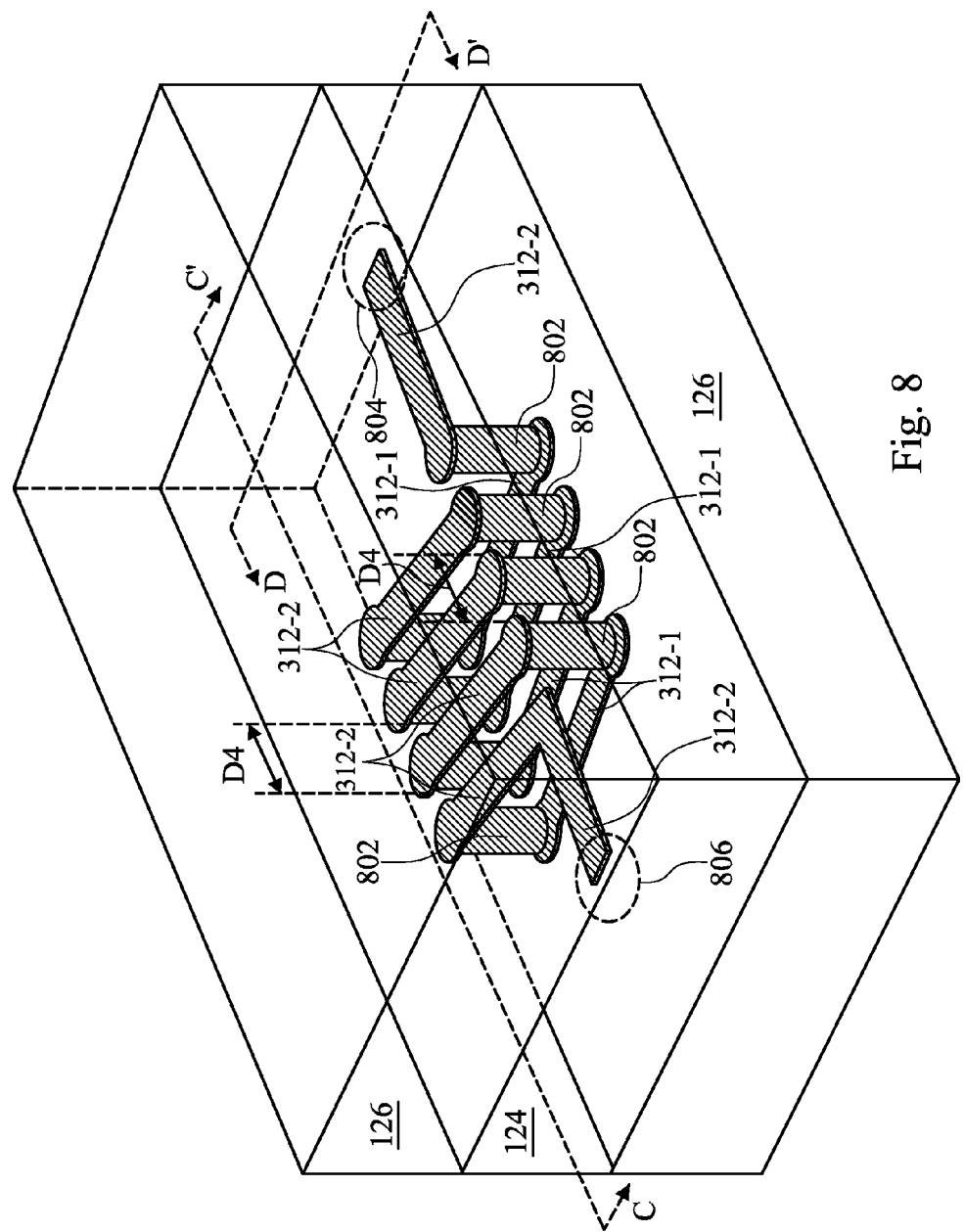
FIG. 8 shows a perspective view of a three-dimensional (3D) inductor, in accordance with an embodiment.

As an example, FIG. 8 shows a perspective view of a three-dimensional (3D) inductor formed using the process flow described above in relation to FIGS. 3A to 3G, in accordance with one or more embodiments. As shown in FIG. 8, a plurality of layers (e.g. two layers) of conductive material 312-1, 312-2 is encapsulated in a plurality of layers of the polymer layer 124. A first level 312-1 of the conductive material 312 may be formed using the process flow described above in relation to FIGS. 3A to 3G. The first level 312-1 of the conductive material 312 may comprise a plurality of conductive lines (e.g. conductive traces), in which adjacent (e.g. immediately adjacent) conductive lines are separated by the fourth dimension D4, which may be in a range from about 2 micrometer to about 10 micrometers (e.g. about 4 micrometers).

Following the formation of the first level 312-1 of the conductive material 312, a plurality of inter-level vias 802 may be formed in the polymer layer 124 that encapsulates the first level 312-1 of the conductive material 312 (e.g. using a combination of photolithography, etching, and plating processes). The plurality of inter-level vias 802 may comprise similar materials as the conductive material 312 and may be electrically coupled to the first level 312-1 of the conductive material 312. Subsequently, a second level 312-2 of the conductive material 312 may be formed over the plurality of inter-level vias 802 (e.g. using the process flow described above in relation to FIGS. 3A to 3G). The second level 312-2 of the conductive material 312 may be electrically coupled to the plurality of inter-level vias 802. The second level 312-2 of the conductive material 312 may comprise a plurality of conductive lines, in which adjacent (e.g. immediately adjacent) conductive lines are separated by the fourth dimension D4, which may be in a range from about 2 micrometer to about 10 micrometers (e.g. about 4 micrometers). Following the formation of the second level 312-2 of the conductive material 312, another layer of the polymer layer 124 may be formed over the second level 312-2 of the conductive material 312, e.g. in order to encapsulate the second level 312-2 of the conductive material 312. Since the second level 312-2 of the conductive material 312 and the first level 312-1 of the conductive material 312 are connected in the manner shown in FIG. 8, the structure shown in FIG. 8 may function as a 3D inductor. The method of forming the 3D inductor shown in FIG. 8 may continue with the formation of the first molding compound 126 over the polymer layer 124 and the 3D inductor. This may be necessary in order to provide structural and mechanical support to the polymer layer 124 as well as the 3D inductor formed therein.

FIGS. 9A to 9D show various views of the 3D inductor shown in FIG. 8. FIGS. 9A and 9B show side views of the 3D inductor shown in FIG. 8 taken along the line C-C' and the line D-D', respectively. The lines C-C' and D-D' are indicated in FIG. 8. As shown in FIGS. 9A and 9B, the first level 312-1 of the conductive material 312, the second level 312-2 of the conductive material 312, and the plurality of inter-level vias 802 are encapsulated in the polymer layer 124, which in turn is sandwiched between a lower layer and an upper layer of the first molding compound 126. FIG. 9C shows a top-down view of the 3D inductor shown in FIG. 8. As shown in the examples of FIG. 8 and FIG. 9C, each of the first level 312-1 of the conductive material 312 may be substantially parallel to one another. Also shown in the examples of FIG. 8 and FIG. 9C, the second level 312-2 of the conductive material 312 may be substantially parallel to one another.

The 3D inductor shown in FIGS. 8 and 9A to 9C may have a first end 804 and a second end 806 opposite the first end 804. The pick-and-place machine used to rotate the structure shown in FIG. 5 to yield the encapsulated via structure 600 shown in FIG. 6 may also be used to rotate the 3D inductor shown in FIG. 8 (e.g. by about 90 degrees). A result of such a step is shown in FIG. 9D. Subsequently, the first end 804 of the 3D inductor may be electrically coupled to the first RDL 118, while the second end 806 may be electrically coupled to the second RDL 120. In so doing, a vertical 3D inductor may be manufactured using the process flow shown in FIGS. 3A to 3J as well as the process flow shown in FIGS. 7A to 7H.

Figure 10:
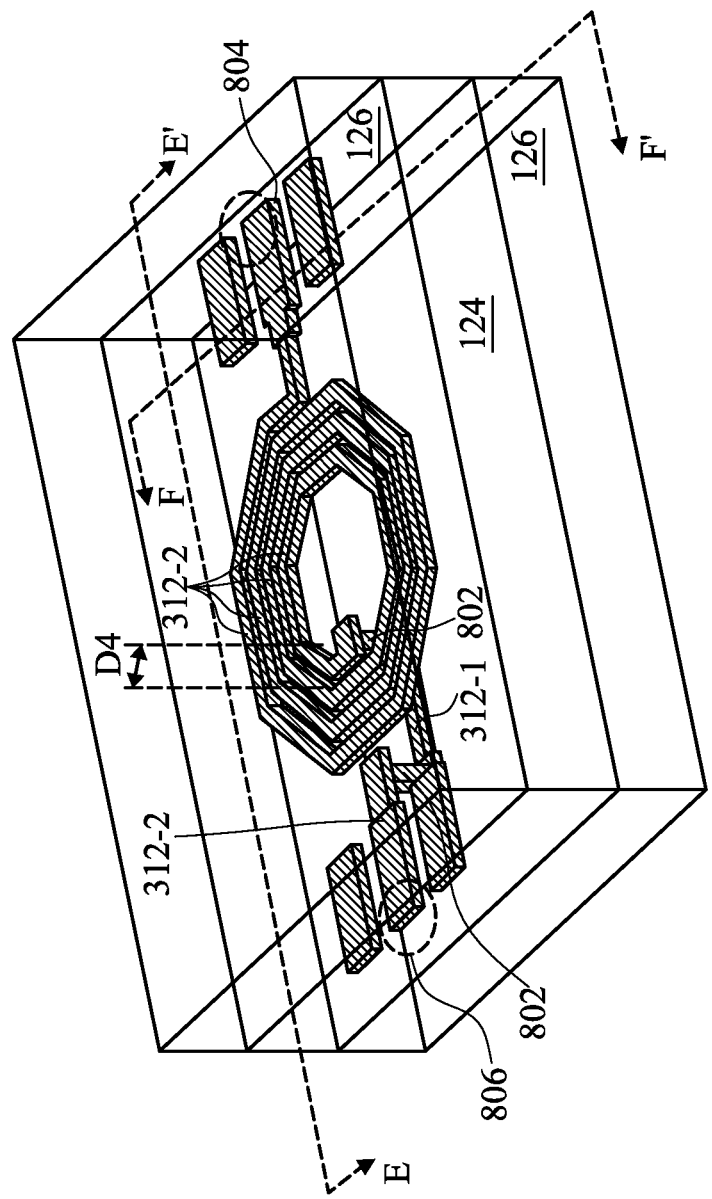
FIG. 10 shows a perspective view of a spiral planar inductor, in accordance with an embodiment.

The shape of the 3D inductor shown in FIG. 8 is merely illustrative, since inductors having other shapes may also be formed using the process flow shown in FIGS. 3A to 3G. As an example, FIG. 10 shows a perspective view of a spiral planar inductor formed using the process flow shown in FIGS. 3A to 3G, in accordance with one or more embodiments. As shown in FIG. 10, a plurality of layers of conductive material 312-1, 312-2 may be encapsulated in a plurality of layers of the polymer layer 124. The first level 312-1 of the conductive material 312 may be formed using the process flow described above in relation to FIGS. 3A to 3G.

Following the formation of the first level 312-1 of the conductive material 312, the plurality of inter-level vias 802 may be formed in the polymer layer 124 that encapsulates the first level 312-1 of the conductive material 312 (e.g. using a combination of photolithography, etching, and plating processes). The plurality of inter-level vias 802 may comprise similar materials as the conductive material 312 and may be electrically coupled to the first level 312-1 of the conductive material 312. Subsequently, a second level 312-2 of the conductive material 312 may be formed over the plurality of inter-level vias 802 (e.g. using the process flow described above in relation to FIGS. 3A to 3G). The second level 312-2 of the conductive material 312 may be electrically coupled to the plurality of inter-level vias 802. The second level 312-2 of the conductive material 312 may comprise a plurality of conductive lines, in which adjacent (e.g. immediately adjacent) conductive lines are separated by the fourth dimension D4, which may be in a range from about 2 micrometer to about 10 micrometers (e.g. about 4 micrometers). Following the formation of the second level 312-2 of the conductive material 312, another layer of the polymer layer 124 may be formed over the second level 312-2 of the conductive material 312, e.g. in order to encapsulate the second level 312-2 of the conductive material 312. Since the second level 312-2 of the conductive material 312 and the first level 312-1 of the conductive material 312 are connected in the manner shown in FIG. 10, the structure shown in FIG. 8 may function as spiral planar inductor. The method of forming the 3D inductor shown in FIG. 10 may continue with the formation of the first molding compound 126 over the polymer layer 124 and the spiral planar inductor. This may be necessary in order to provide structural and mechanical support to the polymer layer 124 as well as the spiral planar inductor formed therein.

FIGS. 11A to 11D show various views of the spiral planar inductor shown in FIG. 10. FIGS. 11A and 11B show side views of the spiral planar inductor shown in FIG. 10 taken along the line E-E' and the line F-F', respectively. The lines E-E' and F-F' are indicated in FIG. 10. As shown in FIGS. 11A and 11B, the first level 312-1 of the conductive material 312, the second level 312-2 of the conductive material 312, and the plurality of inter-level vias 802 are encapsulated in the polymer layer 124, which in turn is sandwiched between a lower layer and an upper layer of the first molding compound 126. FIG. 11C shows a top-down view of the spiral planar inductor shown in FIG. 10.

The spiral planar inductor shown in FIGS. 10 and 11A to 11C may have the first end 804 and the second end 806 opposite the first end 804. The pick-and-place machine used to rotate the structure shown in FIG. 5 to yield the encapsulated via structure 600 shown in FIG. 6 may also be used to rotate the spiral planar inductor shown in FIG. 10 (e.g. by about 90 degrees). A result of such a step is shown in FIG. 11D. Subsequently, the first end 804 of the spiral planar inductor may be electrically coupled to the first RDL 118, while the second end 806 may be electrically coupled to the second RDL 120. In so doing, a vertical spiral planar inductor may be manufactured using the process flow shown in FIGS. 3A to 3J as well as the process flow shown in FIGS. 7A to 7H. The passive devices formed in FIGS. 8 and 10 may, as an example, have a smaller form factor compared to passive devices used in typical InFO packages as a result of the process flow shown in FIGS. 3A to 3J.

According to various embodiments presented herein, a method of manufacturing a die package may include: forming an encapsulated via structure comprising at least one via, a polymer layer encapsulating the at least one via, and a first molding compound encapsulating the polymer layer; placing the encapsulated via structure and a first die stack over a carrier, the at least one via having a first end proximal the carrier and a second end distal the carrier; encapsulating the first die stack and the encapsulated via structure in a second molding compound; and forming a first redistribution layer (RDL) over the second molding compound, the first RDL electrically connecting the at least one via.

According to various embodiments presented herein, a method of manufacturing a die package may include: placing a first die stack over a carrier, the first die stack comprising a plurality of stacked dies; placing an encapsulated via structure over the carrier, the encapsulated via structure comprising a plurality of second vias encapsulated in a polymer layer and a first molding compound; encapsulating the encapsulated via structure and the first die stack in a second molding compound; forming a first redistribution layer (RDL) over a first surface of the second molding compound, the first RDL electrically connected to the plurality of second vias; forming a second RDL over a second surface of the second molding compound opposite the first surface, the second RDL electrically connected to the plurality of second vias; and placing a second die stack over the second RDL.

According to various embodiments presented herein, a die package may include: a first redistribution layer (RDL); a second RDL; a first die stack disposed between the first RDL and the second RDL and electrically coupled to at least one of the first RDL or the second RDL; a plurality of vias laterally separated from the first die stack, the plurality of vias extending between and electrically coupled to the first RDL and the second RDL; a polymer layer encapsulating the plurality of vias; and a molding compound encapsulating the polymer layer and the first die stack, the molding compound disposed between the first RDL and the second RDL and differing in composition from the polymer layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method, comprising:
  forming an encapsulated via structure comprising at least one via, a polymer layer encapsulating the at least one via, and a first molding compound encapsulating the polymer layer;
  placing the encapsulated via structure and a first die stack over a carrier, the at least one via having a first end proximal the carrier and a second end distal the carrier;
  encapsulating the first die stack and the encapsulated via structure in a second molding compound; and
  forming a first redistribution layer (RDL) over the second molding compound, the first RDL electrically connected to the at least one via.

2. The method of claim 1, wherein a plurality of first conductive pillars is disposed between a first surface of the first die stack and the carrier, the plurality of first conductive pillars electrically coupled to the first die stack.

3. The method of claim 1, wherein the first die stack is laterally separated from the encapsulated via structure.

4. The method of claim 1, wherein the forming the first RDL comprises:
  planarizing the second molding compound to expose the second end of the at least one via and a surface of the first die stack facing away from the carrier;
  forming one or more first dielectric layers over the surface of the first die stack and the second end of the at least one via;
  patterning the one or more first dielectric layers; and
  forming conductive features in the patterned one or more first dielectric layers.

5. The method of claim 1, wherein the forming the encapsulated via structure comprises:
  forming a first layer of the first molding compound over a support structure;
  forming a first layer of the polymer layer over the first layer of the first molding compound;
  forming at least one opening in the first layer of the polymer layer;

filling the at least one opening with a conductive material to form the at least one via extending in a first direction parallel to a first axis;

forming a second layer of the polymer layer over the at least one via and the first layer of the polymer layer; and forming a second layer of the first molding compound over the second layer of the polymer layer to form the encapsulated via structure.

6. The method of claim 5, further comprising:

debonding the encapsulated via structure from the support structure; and rotating the encapsulated via structure, wherein the rotating forms the at least one via extending in a second direction substantially perpendicular to the first axis.

7. The method of claim 6, wherein the rotating the encapsulated via structure comprises use of a surface mount technology component placement system.

8. A method, comprising:

placing a first die stack over a carrier, the first die stack comprising a plurality of stacked dies;

placing an encapsulated via structure over the carrier, the encapsulated via structure comprising a plurality of vias encapsulated in a polymer layer and a first molding compound;

encapsulating the encapsulated via structure and the first die stack in a second molding compound;

forming a first redistribution layer (RDL) over a first surface of the second molding compound, the first RDL electrically connected to the plurality of vias;

forming a second RDL over a second surface of the second molding compound opposite the first surface, the second RDL electrically connected to the plurality of vias; and placing a second die stack over the second RDL.

9. The method of claim 8, further comprising encapsulating the second die stack in a third molding compound.

10. The method of claim 8, wherein the first molding compound and the second molding compound are similar in composition.

11. The method of claim 8, wherein the polymer layer and the first molding compound differ in composition.

12. The method of claim 8, wherein the polymer layer comprises a material having a modulus of elasticity in a range from about 0.5 GPa to about 5.0 GPa below glass transition temperature.

13. The method of claim 8, wherein the polymer layer comprises a material having a coefficient of thermal expansion in a range from about 10 ppm/° C. to about 100 ppm/° C. below glass transition temperature.

14. The method of claim 8, wherein the placing the encapsulated via structure over the carrier comprises:

forming a first layer of the first molding compound over a support structure;

forming a first layer of the polymer layer over the first layer of the first molding compound;

etching a plurality of openings in the first layer of the polymer layer;

filling the plurality of openings with a conductive material to form the plurality of vias extending in a substantially horizontal plane;

forming a second layer of the polymer layer over the plurality of vias and the first layer of the polymer layer;

forming a second layer of the first molding compound over the second layer of the polymer layer to form the encapsulated via structure;

rotating the encapsulated via structure to form the plurality of vias extending in a substantially vertical plane; and disposing the encapsulated via structure, having the plurality of vias extending in the substantially vertical plane, over the carrier.

15. A die package, comprising:

a first redistribution layer (RDL);

a second RDL;

a first die stack disposed between the first RDL and the second RDL and electrically coupled to at least one of the first RDL or the second RDL;

a plurality of vias laterally separated from the first die stack, the plurality of vias extending between and electrically coupled to the first RDL and the second RDL;

a polymer layer encapsulating the plurality of vias; and a molding compound encapsulating the polymer layer and the first die stack, the molding compound disposed between the first RDL and the second RDL and differing in composition from the polymer layer.

16. The die package of claim 15, further comprising:

a second die stack disposed at a surface of the second RDL facing away from the first die stack.

17. The die package of claim 15, wherein a distance between adjacent ones of the plurality of vias is in a range from about 2 micrometer to about 6 micrometers.

18. The die package of claim 15, wherein a width of each of the plurality of vias is in a range from about 1 micrometer to about 3 micrometers.

19. The die package of claim 15, wherein the plurality of vias extend between the first RDL and the second RDL by a distance in a range from about 100 micrometers to about 300 micrometers.

20. The die package of claim 15, wherein the polymer layer comprises polybenzoxazole.

\* \* \* \* \*